United States Patent [19]

Scavuzzo

[11] 4,378,505

[45] Mar. 29, 1983

[54] EMITTER FUNCTION LOGIC LATCH AND COUNTER CIRCUITS

[75] Inventor: Robert J. Scavuzzo, Springfield Township, Bucks County, Pa.

[73] Assignee: Bell Telephone Laboratories, Inc., Murray Hill, N.J.

[21] Appl. No.: 191,369

[22] Filed: Sep. 29, 1980

[51] Int. Cl.³ .......................... H03K 3/28; H03K 3/289
[52] U.S. Cl. .............................. 307/289; 307/272 A; 307/455; 377/64; 377/116
[58] Field of Search ............... 307/289, 221 R, 222 R, 307/225 R, 455, 467, 272 A, 220 R

[56] References Cited

U.S. PATENT DOCUMENTS

| 3,040,192 | 6/1962 | Slobodzinski . | |
|---|---|---|---|
| 3,795,822 | 3/1974 | Skokan . | |
| 4,041,326 | 8/1977 | Robinson . | |
| 4,145,623 | 3/1979 | Doucette | 307/289 |
| 4,214,173 | 7/1980 | Popper | 307/224 C |

OTHER PUBLICATIONS

M. Cooperman, "High Speed Current Mode Logic for LSI" IEEE Transactions on Circuits and Systems, vol. CAS-27, No. 7, pp. 626-635, Jul. 1980.
Z. E. Skokan, "Emitter Function Logic-Logic Family for LSI" IEEE Journal of Solid-State Circuits, vol. SC-8, No. 5, pp. 356-361, Oct. 1973.
M. I. Elmasry et al., "Two-Level Emitter-Function Logic Structures for Logic-in-Memory Computers", IEEE Transactions on Computers, vol. C-24, No. 3, pp. 250-258, Mar. 1975.
J. Kane, "A Low-Power, Bipolar, Two's Complement Serial Pipeline Multiplier Chip", IEEE Journal of Solid-State Circuits vol. SC-11, No. 5, pp. 669-678, Oct. 1976.
W. Braeckelmann et al., "A Masterslice LSI for Subnanosecond Random Logic", IEEE Journal of Solid-State Circuits vol. SC-14, No. 5, pp. 829-832, Oct. 1979.

Primary Examiner—John Zazworsky
Attorney, Agent, or Firm—G. W. Houseweart

[57] ABSTRACT

An EFL $\overline{D}$-type latch employing an EFL storage cell (17) controlled by a two-level tree of differential transistor pairs (12, 14 and 32, 34). Also described are counter cells, up counters, down counters and up/down counters, including binary, hexadecimal and BCD types, which can be formed from master/slave combinations of $\overline{D}$-type and D-type latches. Examples of specific three-level and four-level EFL realizations of the counter cells are also described.

39 Claims, 21 Drawing Figures

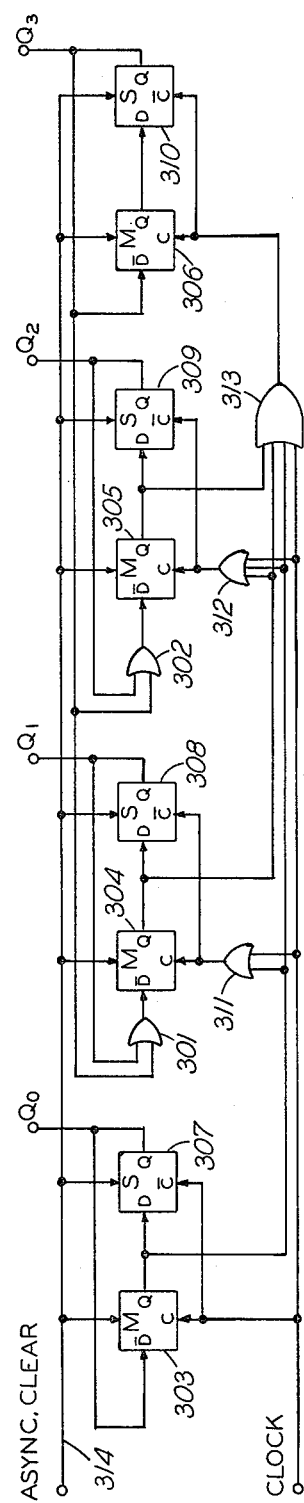
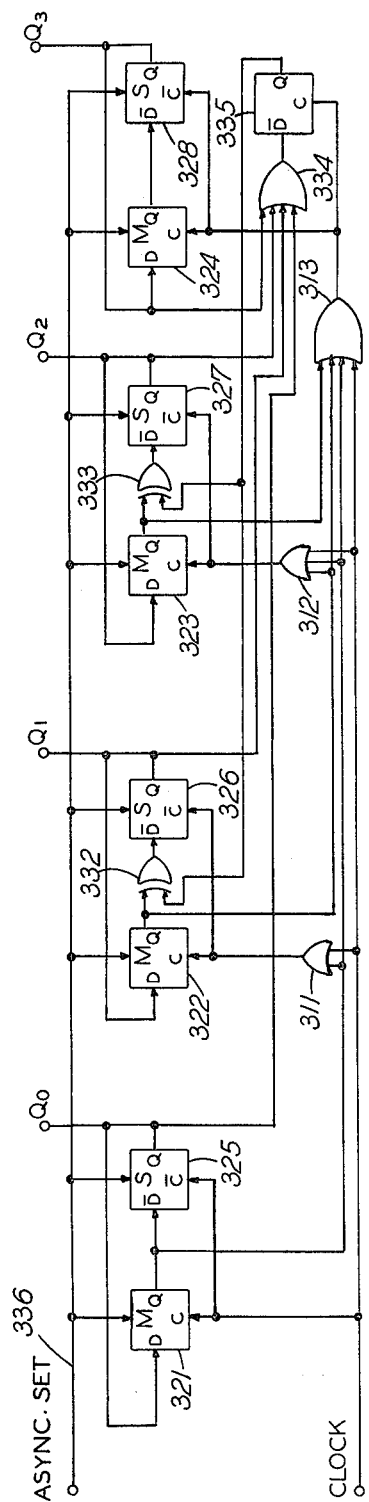
FIG.-19
FIG.-20

EMITTER FUNCTION LOGIC LATCH AND COUNTER CIRCUITS

TECHNICAL FIELD

This invention relates to current mode logic circuits, and, more particularly, to emitter function logic latch and counter circuits.

BACKGROUND OF THE INVENTION

Emitter Function Logic (EFL) is a form of Current Mode Logic (CML) closely related to Emitter Coupled Logic (ECL). While EFL is not as well known as ECL, EFL has been known for several years, and several designs using EFL have been implemented. However, EFL has not been made commercially available as a logic family, although it has been shown to possess a distinct speed-power product advantage over ECL for some circuit configurations. One reason put forth for this relatively slow acceptance of EFL is the lack of both the true and complementary outputs from each gate as is customary with ECL circuits.

While some of the problems associated with the single output are simply ones of inconvenience, requiring a new design for some elementary functions, other problems are more formidable. An example of the latter problem is the design of a synchronous counter cell, which is advantageously implemented in the form of a D-type latch in conjunction with a $\overline{D}$-type (read "D-bar type") latch.

As used herein, the term "latch" is taken as descriptive of a circuit which maintains at an output a binary state indefinitely, regardless of its data input, until enabled by a control signal to accept data at its data input and thereafter to maintain at the output a state indicative of the accepted data. A latch may be noninverting, e.g., D-type, meaning the output is the same logical state as the accepted data input, or inverting, e.g., $\overline{D}$-type, indicating the output is the logical complement of the accepted data input.

While D-type latches are well known in EFL, $\overline{D}$-type latches are not. One example of a $\overline{D}$-type latch is described in U.S. Pat. No. 4,145,623 to R. L. Doucette and herein incorporated by reference. Doucette described an EFL $\overline{D}$-type latch having both true and complementary outputs. However, a close examination indicates at least two drawbacks of the Doucette latch which are believed to adversely affect the switching speed of the latch.

First, as is known in the art, a principal speed limiting node of an EFL gate is the connection of the collector of the common base transistor, the pull-up resistor, and the base of the output emitter follower transistor ($Q_1$, $R_1$, $Q_2$ in the Doucette patent). By connecting additional logic gates directly to this node, Doucette adds capacitance to this critical timing node and thereby adversely affects the switching speed of the gate.

Secondly, the addition of a second pull-up resistor to the collector of the output transistor ($Q_2$ in Doucette) and the connection to the collector of an input transistor ($Q_5$) to this collector junction produces a charge transfer on the collector to base capacitance of these two transistors equal to twice the logic voltage swing. Thus an original advantage of EFL, namely that of producing only a single logic voltage swing across the base to collector capacitance of the transistor, has been compromised.

Thus it can be appreciated that a $\overline{D}$-type latch which switches with speeds comparable to a D-type latch is highly desirable. Also highly desirable are synchronous counters and counter cells which can be, but are not necessarily, implemented in EFL, in view of the speed-power advantages and other advantages which flow from the use of EFL.

Synchronous counters are typically realized with cascaded T flip-flops typically having, for BCD coding and/or for up/down count capability, explicit interconnecting combinatorial logic. For improvement in power-delay product and for other advantages, the structuring of counters without said logic is highly desirable. Furthermore, since flip-flops structured from D-type and/or $\overline{D}$-type latches inherently have a superior power-delay product and other advantages over T flip-flops, the structuring of synchronous counters from said former flip-flops is also highly desirable.

SUMMARY OF THE INVENTION

To these and other ends, an EFL $\overline{D}$-type latch circuit according to one embodiment of this invention includes a combination of a first current steering pair and a storage cell. The storage cell includes a latch input, a control input and an output. An input data terminal is coupled to a control input of the first current steering pair, one of the current paths of which is coupled to the control input of the storage cell and the other of the current paths of which is coupled to a supply voltage terminal.

In one embodiment the first current steering pair includes a differentially coupled transistor pair, having one base coupled to the input data terminal and the other base coupled to a reference voltage. One collector is coupled to the control input of the storage cell, and the other collector is coupled to the supply voltage terminal.

The storage cell includes interconnected input and output multi-emitter transistors. The input multi-emitter transistor is in a common base configuration with one of its emitters functional as the control input of the storage cell and its collector coupled through a resistor to a reference voltage. The output multi-emitter transistor has its collector connected to the supply voltage and its base connected to the collector of the input transistor of the storage cell while one of its emitters forms the output of the storage cell and of the $\overline{D}$-latch. Finally, the second emitters of both the output and input transistors of the storage cell are connected together to form the feedback necessary for storage and thus provide the latch input.

To permit controlled operation, the EFL $\overline{D}$-type latch also includes a second current steering pair, which may also be a differentially coupled transistor pair, for conducting current from the latch input in response to a latch-control signal and to conduct current from the first pair in response to an enable signal.

Also in accordance with this invention are synchronous counter cells including a $\overline{D}$-type latch such as described above and a D-type latch. In such cells, the output of the $\overline{D}$-type latch is coupled to the input of the D-type latch and the output of the D-type latch is coupled to the input of the $\overline{D}$-type latch, thus forming a synchronous counter cell.

Also in accordance with this invention are expedients for initializing these synchronous cells to a predetermined state and synchronous counters comprising an interconnected plurality of the synchronous counter cells.

Also in accordance with this invention are generalized up count cells, down count cells, and up/down count cells adapted for concatenation in accordance with a given Boolean equation to form counters and the counters formed thereby. Still further in accordance with the invention are hexadecimal and BCD counters employing the generalized cells and, in some cases including additional elements.

Also in accordance with this invention are certain circuit reazlizations of the described cells.

BRIEF DESCRIPTION OF THE DRAWINGS

The aforementioned and other features, characteristics, advantages and the invention in general will be better understood from the following more detailed description taken in conjunction with the accompanying drawings in which:

FIG. 19 is a logic block diagram illustrating a synchronous BCD up counter in accordance with this invention;

FIG. 20 is a logic block diagram illustrating a synchronous BCD down counter in accordance with this invention.

Figure 1:
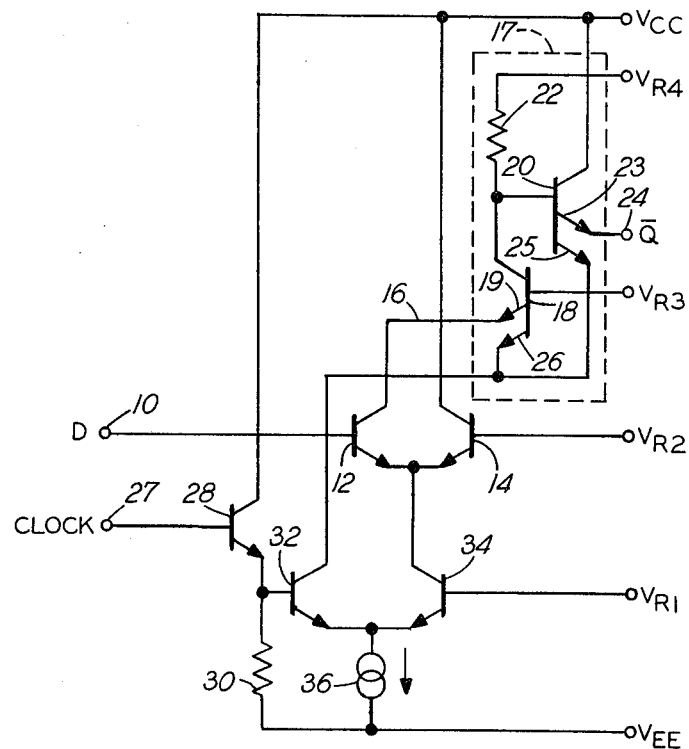
FIG. 1 is a circuit diagram illustrating an EFL $\overline{D}$-type latch in accordance with this invention.

It will be appreciated that for simplicity and clarity of explanation reference numerals have been repeated as considered appropriate in the figures to indicate corresponding features.

DETAILED DESCRIPTION

With reference now to the drawings, FIG. 1 is a circuit diagram of an Emitter Function Logic (EFL) D-type latch according to this invention. An input data signal is received at a data input terminal 10, which in turn is connected to the base of one of a pair of differentially connected single emitter npn transistors 12 and 14. The base of the other differential transistor 14, is connected to a reference voltage $V_{R2}$. The collector of transistor 14 is connected to a positive supply voltage $V_{CC}$, and the collector of transistor 12 is connected to the input line 16 of a storage cell, within broken-line rectangle 17, including two interconnected multi-emitter npn transistors 18 and 20.

Input line 16 to the storage cell 17 connects to a control input, emitter 19 of transistor 18, of the storage cell. The base of transistor 18 connects to another reference voltage $V_{R3}$ while the collector is connected through a pull-up resistor 22 to still another reference voltage $V_{R4}$. Transistor 20 has its collector connected to $V_{CC}$, its base connected to the collector of transistor 18, and a first emitter providing an output 23 connected to an output terminal 24. A second emitter 25 of transistor 20 is connected to a second emitter 26 of transistor 18 to form the feedback for the storage cell and providing a latch input for the storage cell.

Also shown in FIG. 1 is a clocked input control arrangement including a clock input terminal 27 coupled through a voltage shifting transistor 28 to one of a pair of differentially connected npn single emitter transistors 32 and 34, which in turn are driven by a current source 36. As is known in the art, current source 36 may be a constant current source or simply a resistor, whichever may be desired. Voltage shifting npn transistor 28 is in an emitter follower configuration, having its collector connected to $V_{CC}$.

The clock input terminal 27 is connected to the base of transistor 28, the emitter of which is coupled through a line discharge resistor 30 to a negative supply voltage $V_{EE}$. The base of differential transistor 32 is connected to the emitter of transistor 28, and the base of transistor 34 is connected to another reference voltage $V_{R1}$. The collector of transistor 32 is connected to the latch input, i.e., second emitters 25 and 26 of transistors 20 and 18, respectively, while the collector of transistor 34 is connected to the emitters of transistors 12 and 14. Lastly, the emitters of transistors 32 and 34 are connected together and the current source 36 is connected between these emitters and $V_{EE}$.

The following discussion of the operation of the circuit of FIG. 1 will not delve into the basic operation of Current Mode Logic (CML) circuits as they are well known in the art. Also, the theory of operation of EFL circuits has been published by authors in several publications. See, for example, the U.S. Patent to Doucette, reference above. For clarity, and ease of discussion, a brief description will be given of voltage levels operating within the EFL circuit of FIG. 1.

Those in the art will appreciate that the reference voltages $V_{R1}$, $V_{R2}$, $V_{R3}$, $V_{R4}$ are related to each other by multiples of a standard base to emitter voltage differential ($V_{BE}$) for temperature compensation purposes. Thus the differences between the reference voltages can be expressed in absolute terms only for a specified ambient temperature.

With respect to the specific embodiment presented herein, it will be understood that $V_{R2}$ is one $V_{BE}$ more positive that $V_{R1}$. Similarly, $V_{R3}$ is one $V_{BE}$ more positive than $V_{R2}$. $V_{R4}$, however, is only one-half $V_{BE}$ more positive than $V_{R3}$, as is common with EFL biasing.

Pull-up resistor 22 is chosen in conjunction with current source 36 to provide a nominally one $V_{BE}$ voltage drop or less (typically 0.6 to 1.0 $V_{BE}$) across pull-up resistor 22 when current equal to the magnitude drawn by the current source 36 is flowing through it. Thus the voltage at the base of multi-emitter transistor 20 varies between an essentially zero voltage drop with respect to $V_{R4}$ and a voltage equal to one $V_{BE}$ below $V_{R4}$. Consequently, the voltage at emitter 23 of transistor 20, and the voltage at output terminal 24, varies between one $V_{BE}$ less than $V_{R4}$ and up to two $V_{BE}$ less than $V_{R4}$. These two voltage levels form the standard logic signal levels between EFL logic gates. Elementary arithmetic will show that these logic voltage levels are one-half $V_{BE}$ more positive and one-half $V_{BE}$ less positive than $V_{R2}$. Thus the data input signal can be and is differentially compared to $V_{R2}$, while the clock input signal, which is at the same levels as the logic voltage levels, must be shifted down one $V_{BE}$ by transistor 28 to be differentially compared with $V_{R1}$.

As is known in emitter function logic, $V_{R1}$, $V_{R2}$, $V_{R3}$ and $V_{R4}$ are all well regulated, e.g., typically within a few percent, with respect to each other, and are referenced to either $V_{CC}$ or $V_{EE}$. If a positive supply voltage is used, such as $V_{CC}=5$ volts$\pm 10\%$, with $V_{EE}$ at ground potential, then in the preferred embodiment, $V_{R1}$ is chosen to be 1.5 $V_{BE}$ above ground. Since one $V_{BE}$ equals approximately 0.8 volts at room temperature, $V_{R1}$ equals approximately 1.2 volts; $V_{R2}$ (2.5 $V_{BE}$) equals approximately 2.0 volts; $V_{R3}$ (3.5 $V_{BE}$) equals approximately 2.8 volts; and $V_{R4}$ (4 $V_{BE}$) equals approximately 3.2 volts. Supply voltage variations and temperature variations are absorbed by the difference between $V_{CC}$ and $V_{R4}$.

If a negative supply voltage is used, such as $V_{EE}=-5.2$ volts, and $V_{CC}$ is ground, then $V_{CC}$ and $V_{R4}$ could be and normally would be connected together. $V_{R3}$ would be $-0.5$ $V_{BE}$ which is approximately $-0.4$ volts. Similarly $V_{R2}$ ($-1.5$ $V_{BE}$) would equal approximately $-1.2$ volts and $V_{R1}$ ($-2.5$ $V_{BE}$) would equal approximately $-2.0$ volts. In this configuration, voltage supply variations and temperature effects on the bias voltages would be absorbed by the constant current source 36.

Turning now to the operation of the EFL $\overline{D}$-type latch shown schematically in FIG. 1, a clock input signal at clock input terminal 27 is voltage shifted down $V_{BE}$ by the transistor 28 and differentially compared to reference voltage $V_{R1}$ by transistors 32 and 34.

A low voltage or logical ZERO clock input signal causes transistor 34 to conduct current from the common node of the emitters of transistors 12 and 14 and causes transistor 32 to be nonconducting. In this condition, the data input differential transistor pair comprised of transistors 12 and 14 is enabled, while emitters 26 and 25 of transistor 18 and 20 are disabled, in that they do not have a current path to $V_{EE}$.

Under these conditions a logical ONE or high voltage level at the data input terminal 10 will cause transistor 12 to conduct and transistor 14 to be nonconducting, thus extracting current from the input line 16 of the storage cell. The current through transistor 18 also passes through resistor 22, thus causing a voltage drop of one $V_{BE}$ across resistor 22. Thus, the base of transistor 20 is one $V_{BE}$ below $V_{R4}$, and emitter 23 of transistor 20 can drop to two $V_{BE}$ below $V_{R4}$, which corresponds to a logical ZERO at output terminal 24.

Conversely, a logical ZERO or low voltage at the data input terminal will cause transistor 14 to conduct and transistor 12 to be nonconducting. In this condition, there is no current path through transistor 18 and essentially no current through resistor 22. Accordingly, the voltage at the base of transistor 20 is approximately equal to $V_{R4}$, and the voltage at emitter 23 of transistor 20 can be no less positive than essentially one $V_{BE}$ below $V_{R4}$, which corresponds to a logical ONE.

The operation of the $\overline{D}$-type latch described thus far has assumed that the clock input signal has been a logical ZERO. In this condition the operation can be described as providing an output signal at output terminal 24 which is the logical inverse of the input data signal at input terminal 10. When the clock input signal switches to a logical ONE or high voltage level, the storage cell latches itself in its present condition, as described below, and is not further affected by the data input signal until the clock signal again returns to the logical ZERO state.

As the clock input signal rises to a logical ONE level, differential transistor 32 starts to conduct, while differential transistor 34 decreases conduction toward the nonconducting state. The base of transistor 20 is either at $V_{R4}$ or one $V_{BE}$ below $V_{R4}$, while the base of transistor 18 is held constant at $V_{R3}$ (i.e., one-half $V_{BE}$ below $V_{R4}$). When current begins to flow from the common connection of the emitters 25 and 26 of transistors 20 and 18, the voltage level at these emitters will be held at one $V_{BE}$ below the base voltage of one of the two transistors 18 or 20.

If the output 24 of the $\overline{D}$-latch is a logical ONE when the clock input signal begins to rise, the base voltage of transistor 20 is essentially equal to $V_{R4}$. Accordingly, the common emitter connection of emitters 25 and 26 will be clamped one $V_{BE}$ below $V_{R4}$ by transistor 20 and transistor 18 will have a base to emitter voltage at emitter 26 of only one-half $V_{BE}$. A one-half $V_{BE}$ base to emitter voltage drop is not enough to allow transistor 18 to conduct. Thus all of the current from the common connection of emitters 25 and 26 will pass through transistor 20. The base of transistor 20 is held at $V_{R4}$ since essentially no current flows through resistor 22.

If on the other hand, the output 24 is a logical ZERO when the clock input signal begins to rise, the base of transistor 20 is one $V_{BE}$ below $V_{R4}$ and the voltage at emitters 25 and 26 will be clamped one $V_{BE}$ below $V_{R3}$ by transistor 18. Transistor 20 will have a base to emitter voltage of only 0.5 $V_{BE}$, not enough to allow transistor 20 to conduct. Thus essentially all of the current from the common connection of emitters 25 and 26 passes through transistor 18, and the base of transistor 20 is held at one $V_{BE}$ below $V_{R4}$, i.e., at logical ZERO, due to the current flow through resistor 22.

It will be appreciated that while the clock input signal remains at a logical ONE, transistor 32 pulls current from the common connection of emitters 25 and 26, thus keeping the storage cell 17 latched at the logical state which obtained when the clock rose to the logical ONE. Also, with transistor 32 conducting, transistors 34, 12 and 14 are nonconducting. For this reason the input terminal 10 is effectively disabled and has no effect on the state of cell 17. Conversely, of course, when the clock input signal is a logical ZERO, transistor 32 becomes nonconducting, which unlatches storage cell 17; and transistor 34 becomes conducting, which enables the differential current steering pair of transistors 12 and 14 to control the state of the storage cell 17 in response to a data input D on terminal 10.

SYNCHRONOUS COUNTER CELL

Figure 2:
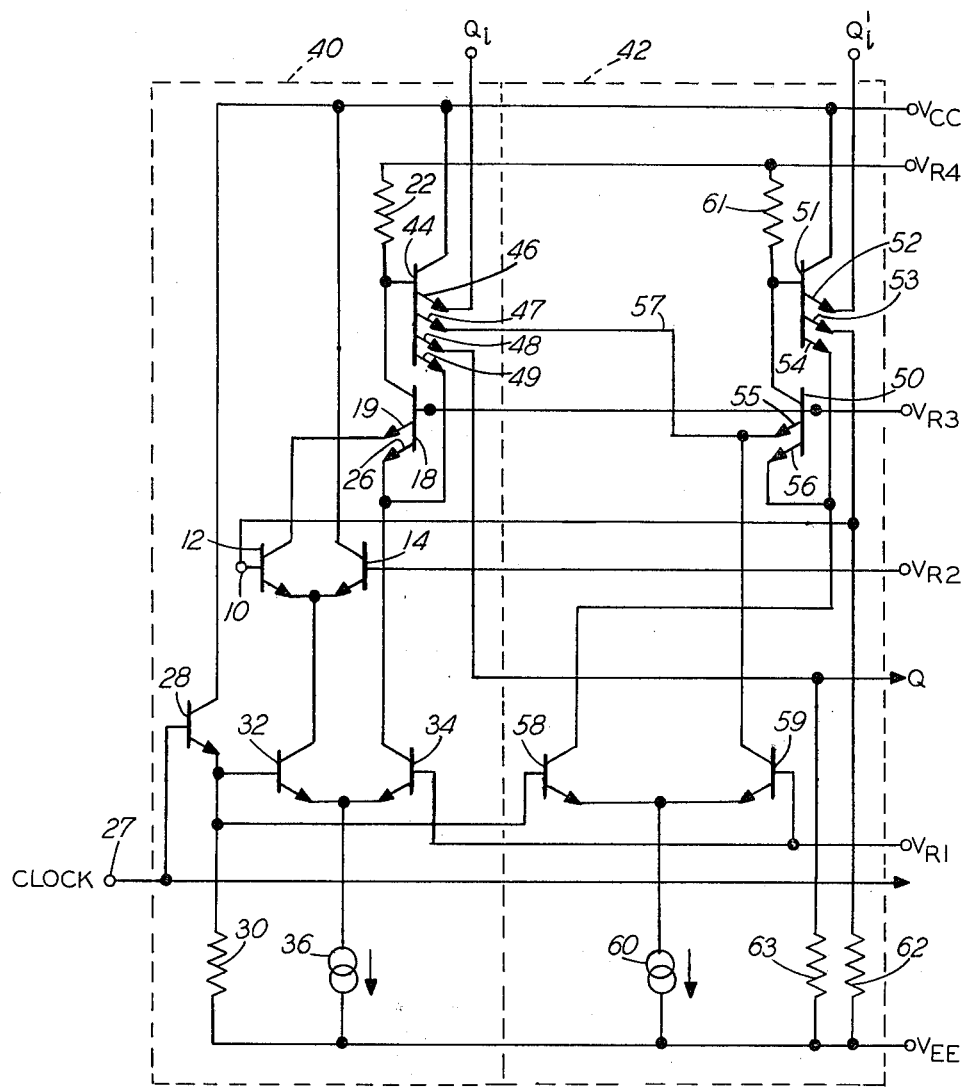
FIGS. 2, 3 and 4 are circuit diagrams illustrating three embodiments of EFL synchronous counter cells in accordance with this invention.

A synchronous counter cell, one embodiment of which is illustrated schematically in FIG. 2, utilizes the $\overline{\text{D}}$-type latch of FIG. 1 as a master section shown within broken line rectangle 40 and a conventional D-type latch as a slave section shown within broken-line rectangle 42.

The $\overline{\text{D}}$-type latch of the master section 40 is the same as the circuit of FIG. 1 with the following exceptions. First, transistor 20 of FIG. 1 has been replaced by a four-emitter transistor 44, having emitters 46–49, as shown in FIG. 2. The extra two emitters are used to provide two additional outputs for the $\overline{\text{D}}$-type latch.

Second, in FIG. 2 the roles of current steering transistors 32 and 34 have been reversed inasmuch as the collector of transistor 32 is in FIG. 2 connected to the common emitters of transistors 12 and 14 and the collector of transistor 34 is in FIG. 2 connected to the common emitters 26 and 49 of the storage cell rather than as they were otherwise connected in the circuit of FIG. 1. This reversal simply has the effect of reversing the role of the clock, i.e., the $\overline{\text{D}}$-type of FIG. 2 is enabled to receive and store data by a logical ONE clock pulse rather than, as in the circuit of FIG. 1, by a logical ZERO clock pulse.

The D-type latch of slave section 42 includes two multi-emitter input and output transistors 50 and 51, respectively, forming a storage cell which operates analogously to the storage cell 17 of FIG. 1. To that end, as in the $\overline{\text{D}}$-type latch, a resistor 61 couples the common connection of the base of output transistor 51 and the collector of transistor 50 to reference voltage source $V_{R4}$. As with pull-up resistor 22 of the $\overline{\text{D}}$-type latch, resistor 61 is chosen to provide a nominally one $V_{BE}$ voltage drop or less when current of magnitude equal to that drawn by a current source 60 flows therethrough.

The D-type latch of slave section 42 also comprises a clocked input control arrangement including differential transistors 58 and 59 and the current source 60. This clocked current steering portion of the D-type latch operates in the manner as that of the $\overline{\text{D}}$-type latch except that, as will be described, the master section 40 and the slave section 42 become enabled and latched at different cycles of the clock input signal, thus giving rise to the master-slave relationship.

As shown in FIG. 2, an input line 57 analogous to input line 16 of the $\overline{\text{D}}$-type latch, couples an output emitter 47 of the $\overline{\text{D}}$-type latch of master section 40 to an input emitter 55 of the D-type latch of slave section 42; and one output of the D-type latch at emitter 53 of transistor 51 is connected to the input 10 of the D-type latch. A line discharge resistor 62 couples the line connecting emitter 53 and input terminal 10 to $V_{EE}$.

It should be noted that separate isolated logic state outputs $Q_i$ and Q are taken from separate emitters 46 and 48, respectively, of transistor 44 of the $\overline{\text{D}}$-type latch in master section 40. The $Q_i$ output designation indicates this cell is the "i-th" cell in a series and is to allow parallel output from the cells in the series. The Q output is intended to be coupled to the next cell in the series and, as such, is shown coupled through a line discharge resistor 63 to $V_{EE}$. A $Q_i'$ output from emitter 52 of slave section 40, analogous to the $Q_i$ output, couples the logic state of the D-type latch for parallel output purposes and for counter convenience as discussed in more detail below.

In operation, a logical ONE on the clock input terminal 27 enables the input transistors 12 and 14 of the $\overline{\text{D}}$-type latch through transistor 32 and also latches the D-type storage latch through transistor 58. During the opposite phase of the clock, i.e., a logical ZERO condition on the clock input terminal 27, the $\overline{\text{D}}$-type latch is latched through transistor 34, and the D-type latch is enabled through transistor 59 to pass data from its input to its output.

Since the $\overline{\text{D}}$-type latch of master section 40 inverts the data, while the D-type latch of slave section 42 does not, the synchronous counter cell operates as a two-stage shift register with an inverting gate coupling the output of the shift register back to the input as shown in the table below:

| Clock Input Signal | $Q_i$ | $Q_i'$ |
|---|---|---|
| 0 | 0 | 0 |
| 1 | 1 | 0 |
| 0 | 1 | 1 |
| 1 | 0 | 1 |
| 0 | 0 | 0 |

As can be seen from the table, the $Q_i$ and $Q_i'$ outputs are both equal in frequency to the clock frequency divided by two. Also the $Q_i'$ output is the same as the $Q_i$ output after being shifted (delayed) by one-half clock cycle. The advantage of having both $Q_i$ and $Q_i'$ outputs will be shown below with regard to FIGS. 7 and 8.

Figure 3:
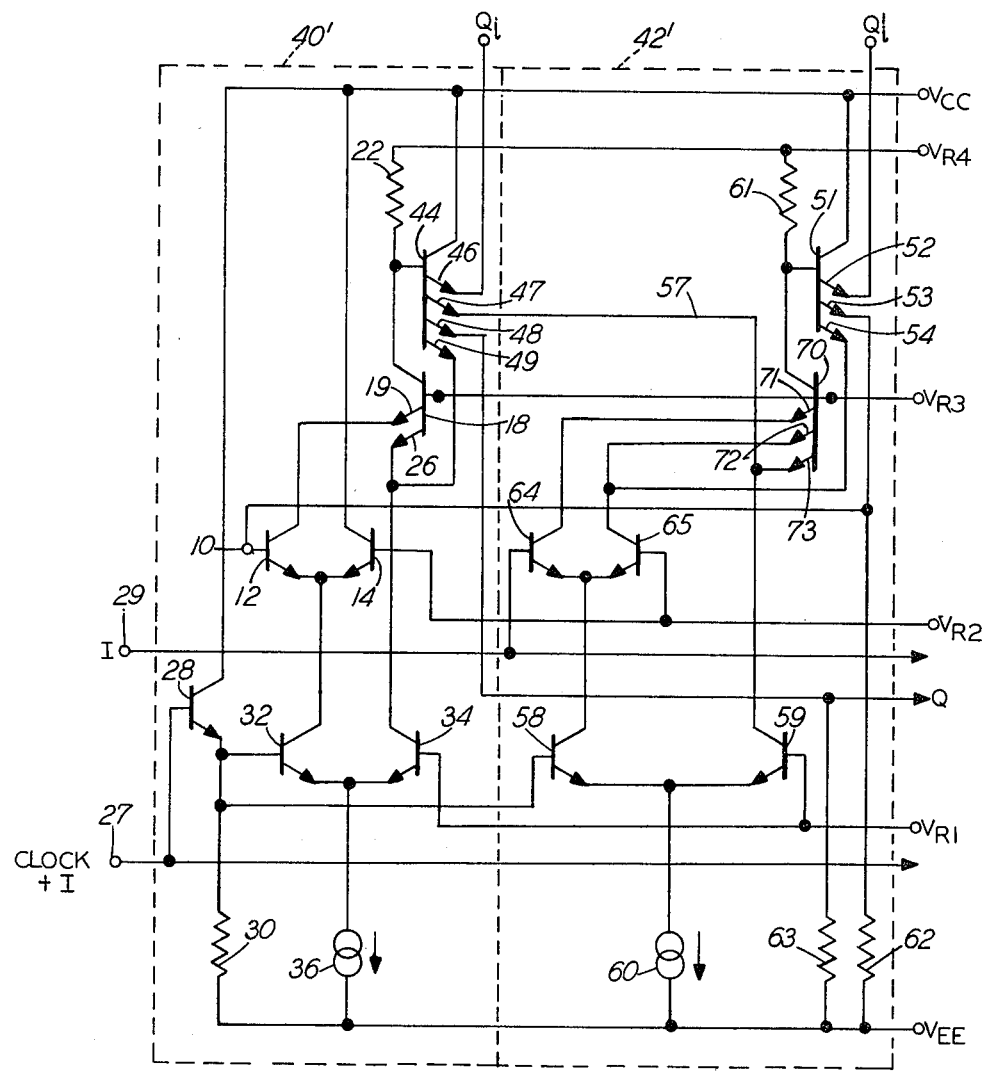
Figure 4:
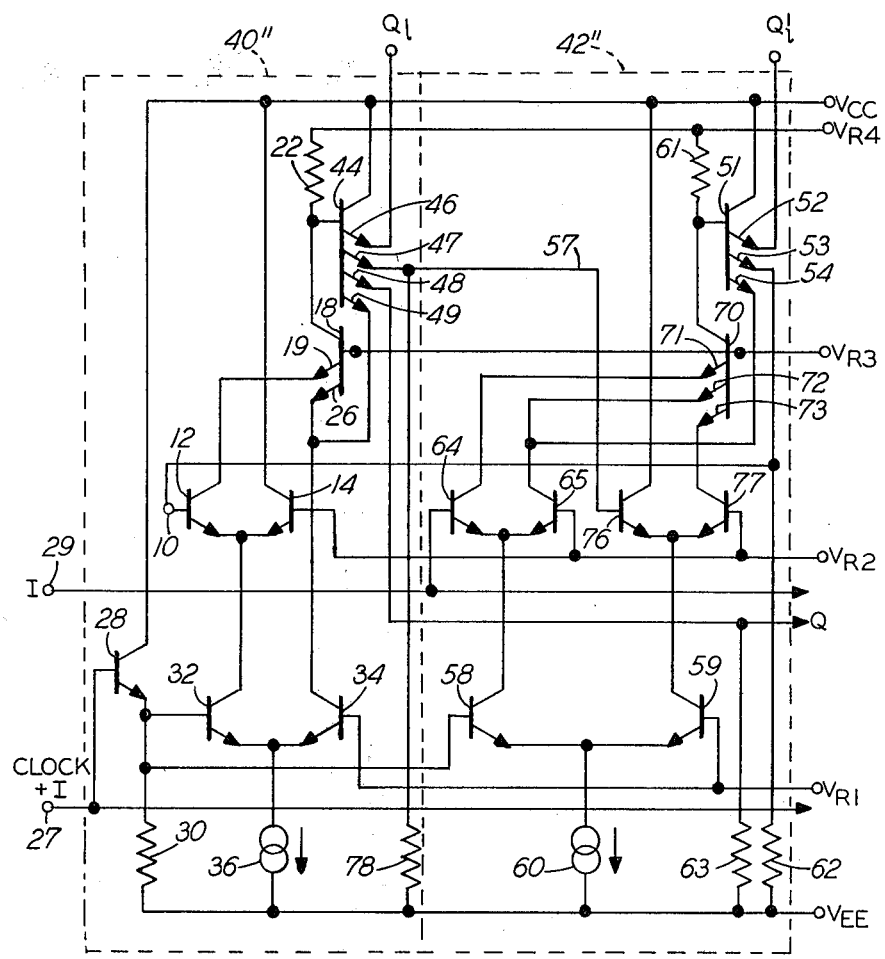

Two different modifications of the synchronous counter cell of FIG. 2 to allow initialization in accordance with the teachings of the copending application Ser. No. 191,393 filed of even date hereof in the name of the same R. J. Scavuzzo, are shown in FIGS. 3 and 4. FIG. 3 is a circuit diagram wherein an initialization input terminal 29 and a differential current steering pair of transistors 64 and 65 have been added to the circuit of FIG. 2. Specifically an initilization input terminal 29, for receiving an initializing signal (I), is connected to the base of one transistor 64 of the additional differentially connected pair of current steering npn transistors 64 and 65. The base of transistor 65 is connected, along with the base of transistor 14, to $V_{R2}$.

Additionally, a three-emitter transistor 70, having emitters 71–73, has been substituted for dual-emitter transistor 50. The additional emitter 71 is connected to the collector of transistor 64. The collector of transistor 65 is connected to the feedback common connection of two emitters, 54 and 72 of transistors 51 and 70, respectively.

In operation, a logical ONE initialization signal at input terminal 29 causes transistor 64 to conduct, thus steering current from transistor 65 to unlatch the storage latch of the slave section within broken-line rectangle 42' and pull current through emitter 71 and resistor 61, thus placing a logical ZERO at the output of the D-type latch of slave section 42'. With the output of slave section 42' at a logical ZERO, transistor 12 is nonconducting, thereby forcing the output of the master section 40' to a logical ONE. It will be appreciated that the signal at terminal 27 must be a logical ONE during the initialization operation. In the preferred embodiment the CLOCK is logically ORed with the initialization (I) signal by circuitry, including conventional tie-ORing, not shown in FIG. 3. It will be appreciated that the designation of "CLOCK+I" at terminal 27 in FIG. 3 is intended to indicate that the logical OR of the clock and the initialization signal I is applied to terminal 27. Thus, when the initialization signal rises to a logical ONE, the clock input at terminal 27 will also rise to a logical ONE, thus allowing the initialization procedure to occur.

FIG. 4 is another embodiment of a synchronous counter cell with an initialization capability. A pair of differential current steering transistors, 76 and 77, and a pull-down resistor 78 have been added to the circuitry of FIG. 3. Differential transistors 76 and 77 have their emitters connected together and to the collector of transistor 59, while the base of transistor 76 is connected to output emitter 47 of the $\overline{D}$-type latch of the master section within the broken-line rectangle designated 40″. The collector of transistor 76 is connected to $V_{CC}$; the base of transistor 77 is connected to $V_{R2}$ and the collector of transistor 77 is connected to input emitter 73 of transistor 70 in the slave section within the broken-line rectangle designated 42″. Pulldown resistor 78 is connected between output emitter 47 and $V_{EE}$.

In operation, during logical ZERO portions of the CLOCK+I input signal at terminal 27, transistor 59 is conducting, while transistor 58 is cut off. A logical ONE output at emitter 47 of master section 40″ causes transistor 76 to conduct and transistor 77 to be essentially nonconducting. As a result, essentially no current passes through transistor 70, and the slave section has a logical ONE output state. Conversely, a logical ZERO from the master section 40″ enables transistor 77 to conduct, and the output of slave section 42″ is a logical ZERO.

Of the three embodiments shown in FIGS. 2, 3 and 4 for synchronous counter cells, the circuit of FIG. 3 is presently considered a preferred embodiment, inasmuch as the circuit of FIG. 3 provides the initialization capability without the extra complexity and delay introduced by the additional components in the circuit of FIG. 4.

SYNCHRONOUS COUNTER CELL INERCONNECTIONS

Figure 5:
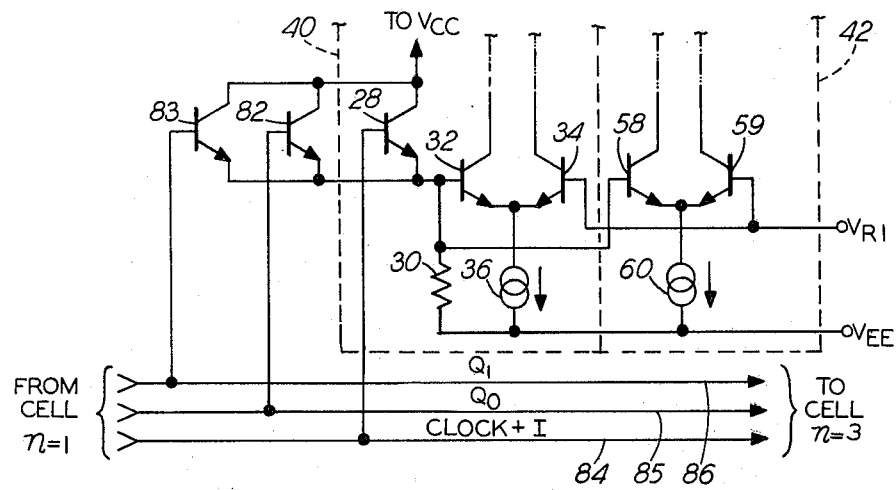
FIGS. 5 and 6 are circuit diagrams illustrating two methods of interconnecting the synchronous counter cells to form counters.
Figure 6:
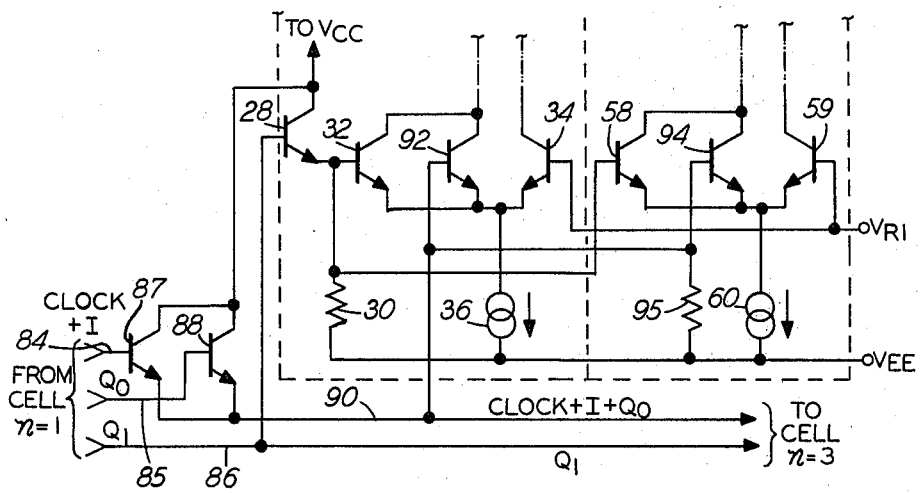

The synchronous counter cells described in detail with respect to FIGS. 3 and 4 can be cascaded to form multiple cell, i.e., multiple bit, synchronous counters by using any of a variety of appropriate counter cell interconnection circuits. FIGS. 5 and 6 are schematic diagrams of alternate embodiments of preferred interconnection circuitry in accordance with this invention.

As will be understood by those in the art, each cell of a multiple-cell synchronous counter changes its logical state upon the next clock cycle if all of the cells (lower significant bits) preceding it have a logical ONE output for an up counter, or all have a logical ZERO output for a down counter. Thus, expedients must be provided to logically combine the outputs of each of the preceding cells.

The circuits of FIGS. 5 and 6 are adapted to logically combine the outputs of all preceding stages through an OR function. This OR function is logically equivalent to a negative logic AND function for all of the preceding low output states, i.e., in order for the output of an OR gate to be at a logical ZERO, all of the inputs must be a logical ZERO. Thus, as will be shown in detail hereinbelow, the interconnections of FIGS. 5 and 6 provide a down counter function at the $Q_i$ outputs of each synchronous counter cell and simultaneously provide at the $Q_i'$ outputs in the same counter an up count function, as will be shown in the discussion pertaining to FIGS. 7 and 8.

The circuit diagrams of FIGS. 5 and 6 represent interconnections between a second stage (n=1) and a third stage (n=2) of a synchronous counter having its first cell numbered n=0, second cell numbered n=1, etc. The direct implementation of the OR function between stage n=1 and n=2 is shown in FIG. 5, which also shows a partial circuit diagram of a synchronous counter cell of the type depicted in FIGS. 3 or 4. Additional transistors 82 and 83 have been added in parallel with clock input transistor 28, the base of which is coupled to a "CLOCK+I" line 84. The bases of the additional transistors are connected to the Q outputs, $Q_0$ and $Q_1$ on lines 85 and 86, respectively, of the two previous cells. In operation, if any one or more than one of transistors 28, 82, and 83 are conducting, transistors 32 and 58 will be conducting. Thus, the third cell will not change logical state until all three of transistors 28, 82 and 83 become nonconducting. This condition occurs only when a logical ZERO obtains on all three lines 84–86, i.e., only when the two previous counter cells have a logical ZERO output and the "CLOCK+I" is also at a logical ZERO.

FIG. 6 represents an alternate method of producing the OR function between counter stages. Parallel transistors 87 and 88 provide a logical OR of the "CLOCK+I" and $Q_0$ logic states at a line 90 which, in turn, is coupled to the bases of two additional transistors 92 and 94 which have been inserted in parallel with transistors 32 and 58, respectively i, in the master section and slave section, respectively. A line discharge resistor 95 has also been added to couple the bases of transistors 92 and 94 to $V_{EE}$. Because of the level shifting through transistors 87 and 88 the logic signal levels at line 90 are voltage-compatible with the differential transistors 32 and 58.

In operation, a logical ONE on any one or more of lines 84–86 causes at least one of parallel transistors 32 and 92 to be conducting and at least one of parallel transistors 58 and 94 to be conducting, and thus the logical state of the third stage (n=2) remains unchanged during such time. Only when $Q_0$, $Q_1$ and "CLOCK+I" all become logical ZERO can transistors 34 and 59 conduct and change the logical state of the stage.

The circuits of FIGS. 5 and 6 have different advantages to each. The implementation of FIG. 5 is direct and produces the fastest switching speeds of the individual counter cells. However, a bus line is required for each previous stage of a counter. The implementation of FIG. 6 decreases the number of interconnection buses, but decreases slightly the switching speed of the stages due to the added capacitance at the emitters of the current steering transistors. Each implementation therefore would be possibly preferable for different applications.

SYNCHRONOUS COUNTER TIMING

Figure 7:
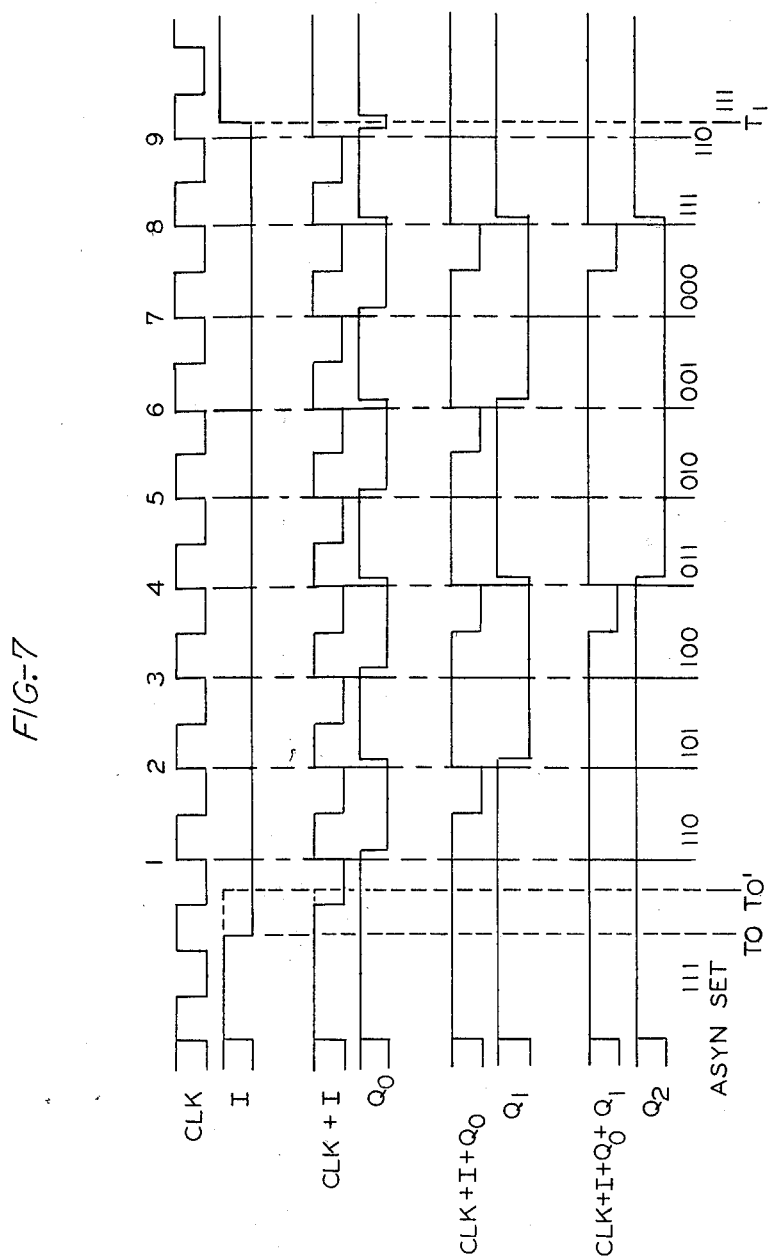
FIGS. 7 and 8 are timing diagrams for a three-cell synchronous counter constructed in accordance with this invention.
Figure 8:
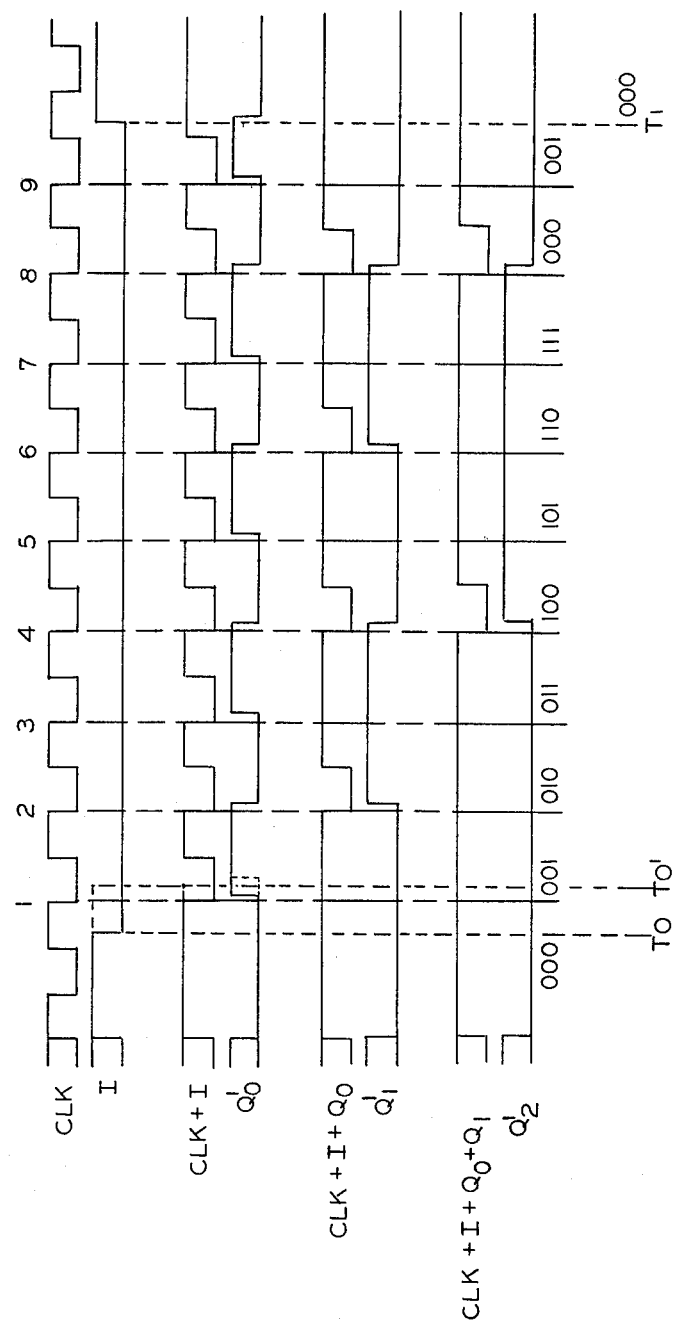

FIGS. 7 and 8 are timing diagrams for a synchronous binary counter comprising three counter cells such as shown in FIGS. 3 or 4 interconnected with OR functions of the type shown in FIGS. 5 or 6. FIG. 7 is a timing diagram for a down counter, while FIG. 8 is a timing diagram for an up counter.

The top waveform of FIG. 7 is a free running system clock signal, and below is the initialization signal shown as I. The counting sequence, which moves in time from left to right, begins with I at a logical ONE, hereinafter written for convenience as "1," which sets all of the $Q_i$ outputs of the three stages to a logical 1. Thus, the down counter is preset to the 111 state as shown at the bottom of FIG. 7.

At time T0, the initialization pulse becomes a logical ZERO, hereinafter written for convenience as "0," to enable the counter to begin counting. The clock ORed with I, "CLK+I," forms a clock input to the first counter cell. As will be appreciated, a synchronous down counter formed from the circuits of FIGS. 3-6 will be what is commonly termed "positive edge triggered" in that the $Q_i$ outputs of the counter will change state at the transition of the clock signal from a logical 0 to a logical 1. The $Q_i$ outputs of the second and third counter cells are also shown in FIG. 7, with the corresponding clock input signals comprising the OR function of the system clock, the initialization signal, and the $Q_i$ outputs from the preceding counter cells.

As shown in FIG. 7, in the absence of an intervening initialization signal, the down counter counts down to the 000 state, and begins to repeat the cycle by changing to the 111 state at the next system clock rising edge transition. At arbitrary time T1, when, for purpose of illustration, the counter is in the 110 state, for example, the initialization signal is brought to the logical 1 state which again initializes the counter to the 111 state.

FIG. 8 is a timing diagram of a three-stage synchronous up counter using the synchronous counter cells of FIG. 3 or 4. The up counter is realized by using the $Q_i'$ outputs of the counter cells. As shown in FIG. 8, logical 1 on the initialization signal I resets all of the $Q_i'$ outputs to a logical ZERO, and the counter counts from the 000 in binary numerical sequence to the 111 state and then to the 000 state to begin the count again. FIG. 8 is very similar to FIG. 7 with the $Q_i'$ output waveforms substituted for the Q output waveforms.

However, one important difference between the down counter and the up counter is the time relative to the system clock in which transitions occur at the output. More specifically, as discussed above, the down counter is positive edge triggered, i.e., the $Q_i$ outputs change state when the system clock changes from the logical ZERO to the logical ONE state. However, the up counter is negative edge triggered, i.e., $Q_i'$ outputs change state at logical ONE to logical ZERO transitions of the system clock. This half cycle offset may be advantageous for certain applications.

Another ramification of this difference is that the initialization signal can be asynchronous for the down counter without producing a false count as shown in phantom in FIG. 7 when the I is now assumed to change at a time designated T0'. Thus, the initialization signal can go to a logical ZERO during either phase of the system clock and still initialize the $Q_i$ outputs of the counter to the 111 state.

The up counter of FIG. 8, on the other hand, is subject to a false starting count since the $Q_i'$ outputs change state whenever the clock ORed with I changes from a logical 1 to a logical 0 state. Thus, as shown in FIG. 8, the counter is initialized to 000 when I is a logical 1 and a change in I from 1 to 0 at time T0, when the system clock is high, allows the counter to advance to 001 in synchronous fashion when the clock subsequently changes from 1 to 0. However, a change in I from 1 to 0 at a time T0' when the clock is low, allows I, rather than the clock to advance the count to 001, which is not synchronous operation and is therefore considered false. A solution is to synchronize the initialization signal by preventing I from falling while the clock is low. As will be recognized by those in the art, this synchronization can be produced by conventional logic circuitry. For example, one solution (not shown) is to connect I to a D-type latch similar to the slave section of FIG. 2, except that the base connections to transistors 58 and 59 would be reversed. The clock input to the D-type latch would be the system clock. The synchronous CLOCK+I signal would then be the logical OR of the system clock and the output of the D-type latch.

With the foregoing detailed description in mind, it can be readily appreciated that the logic block diagram of FIG. 9 can be taken as representing a generalized i-th cell of an n-stage synchronous binary up-counter of the type described with reference to FIGS. 1-6 and 8. As shown, the cell includes a $\overline{D}$-type latch 81 having an input terminal $\overline{D}$, an output terminal Q, and a clock input terminal C serving as a master section and a D-type latch 82, having an input terminal D, an output terminal Q and a clock input terminal C, serving as a slave section. The output $Q_i$ of slave 82 is the output of the cell and, as heretofore described, is also coupled to the input of the master 81. The output $Q_i^M$, (the superscript "M" designating "Master") is coupled to the input of slave 82 and also through combinational logic (not shown), e.g., of the type shown in FIGS. 5 and 6, to the next cell (not shown), i+1.

The i-th cell is controlled by a control signal $C_i$, which is produced by forming the logical OR of a CLOCK which provides a count signal with the $Q_j^M$ logic states of all preceding cells. This can be written generally in the form of a Boolean equation as follows:

$$C_i = CLOCK + Q_{i-1}^M + Q_{i-2}^M + ... + Q_1^M + Q_0^M,$$

where, of course, the counter cells are numbered from zero through i to n, where n is one less than the total number of cells in the counter.

Figure 9:
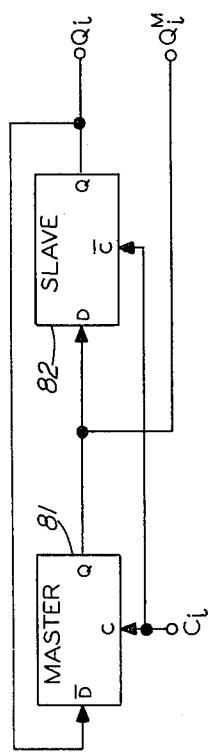
FIG. 9 is a logic block diagram of a generalized cell for a synchronous binary up counter in accordance with this invention.

It will be understood that for simplicity and clarity of explanation the description with reference to FIG. 9 and all ensuing figures will not deal with an initialization capability since provision of such capability is straight-forward in light of the foregoing discussion with reference to FIGS. 3-8 and in light of the teachings of three copending applications having Ser. Nos. 191,393, 191,394 and 191,395, filed of even date herewith, naming the same R. J. Scavuzzo as inventor and assigned to the assignee hereof, all of which are hereby incorporated herein by reference.

For completeness it should be understood that the C and $\overline{C}$ terminology assigned to input terminals of master 81 and slave 82 are to indicate that the master and slave operate out of phase with each other, as with the counters of FIGS. 2-8. More specifically, one is positive-edge triggered and the other is negative-edge triggered so that one is disabled while the other is enabled and vice versa.

Figure 10:
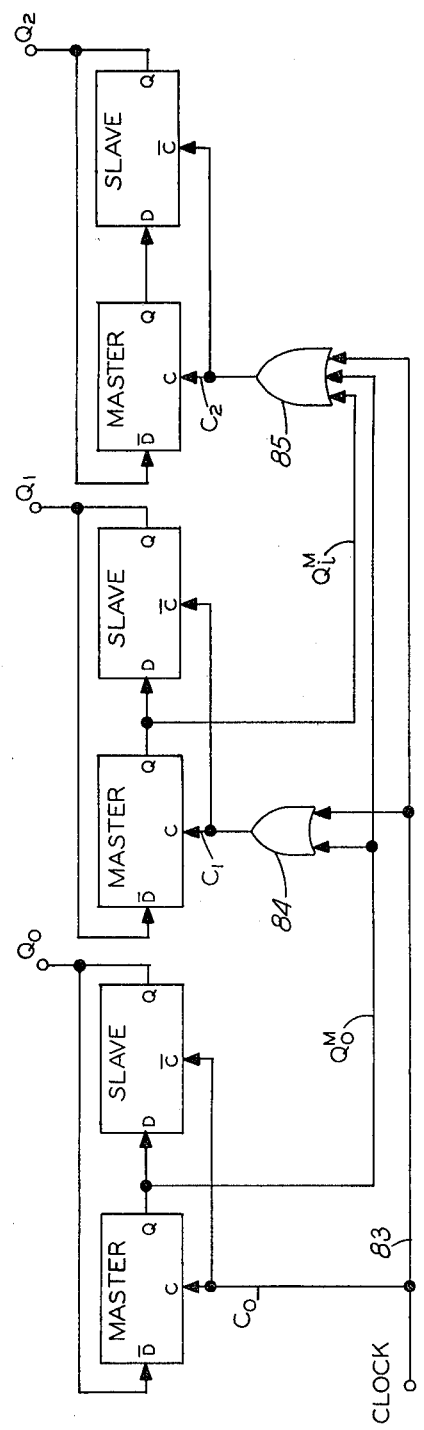
FIG. 10 is a logic block diagram of a three stage synchronous binary up counter employing the cells of FIG. 9 in accordance with this invention.

With reference now to FIG. 10, there is shown a logic block diagram of a three-stage, i.e., three-bit, synchronous binary up counter of the type indicated by the timing diagram of FIG. 8 and the discussion with respect to FIGS. 2-6 and 8. As seen, the cell of FIG. 9 is used in each stage, numbered 0, 1 and 2. Consistent with the foregoing Boolean equation, a clock signal on a line 83 provides a control input $C_0$ which is applied to the C and $\overline{C}$ inputs of both the master and slave of the first stage. The output $Q_0^M$ of the master of the first stage is combined by an OR gate 84 with the clock signal on line 83 to provide a control signal $C_1$ which is applied to the C and $\overline{C}$ inputs of the master and slave, respectively, of the second stage. In like manner, the output $Q_1^M$ of the master of the second stage is logically combined by an OR gate 85 with $Q_0^M$ and the clock to provide a control input $C_2$ to the third stage.

In operation, like that illustrated in FIG. 8, the output $Q_0$, $Q_1$ or $Q_2$ of each cell changes state only upon transition of its respective control input $C_0$, $C_1$ or $C_2$ from high to low. This occurs only when all preceding $Q_i^M$ and the clock transition from high to low. Accordingly, in the absence of initialization, the count proceeds with each clock cycle from wherever the count starts, e.g., for illustration, the binary number 010, in increasing binary numerical sequence to 111 and then to 000, 100, 010, etc.

Of course, it will be appreciated that arbitrarily many of the cells of the type illustrated in FIG. 9 may be concatenated in accordance with the foregoing Boolean equation to provide a synchronous binary up counter having as many bits as desired. It will also be understood that neither the specific $\overline{D}$-type latch of FIG. 1 nor the specific counter cells and interconnections of FIG. 2-6 need be used in implementing the cells of FIG. 9 and the interconnections.

SYNCHRONOUS BINARY DOWN COUNTER

Figure 11:
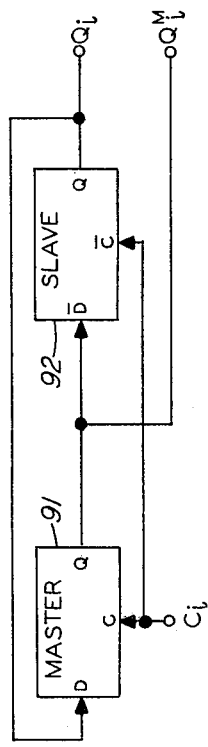
FIG. 11 is a logic block diagram of a generalized cell for a synchronous binary down counter in accordance with this invention.

With reference now to FIG. 11, there is shown a logic block diagram of a generalized i-th cell of a synchronous binary down counter. As seen, the cell of FIG. 11 is similar to the cell of FIG. 9 except that in FIG. 11, the master 91 is a D-type latch and the slave 92 is a $\overline{D}$-type latch. For a specific circuit realization of the cell of FIG. 11 one can use the D-type latch of the type shown in rectangle 42 in FIG. 2 for master 91 and the $\overline{D}$-type latch of the type shown in rectangle 40 in FIG. 2 as the slave 92, as is shown in FIG. 12, where the numerals of FIG. 2 have been used for clarity.

Figure 12:
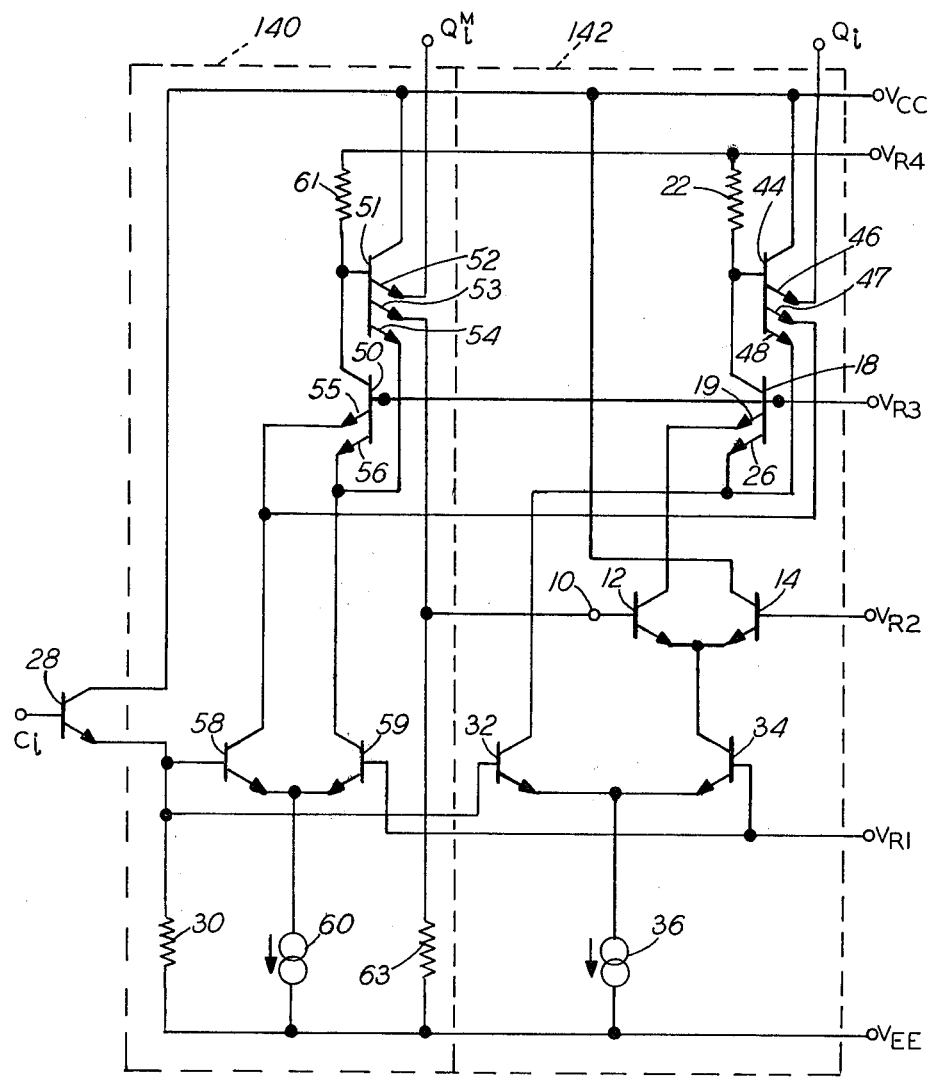
FIG. 12 illustrates a 3-EFL circuit realization of the cell of FIG. 11 in accordance with this invention.

As seen in FIG. 12, when $C_i$ is high, transistor 58 is conducting and 59 is nonconducting, thus enabling the master D-type latch, within broken-line rectangle 140, to read and assume at its output, $Q_i^M$, the state of the output, $Q_i$, of the $\overline{D}$-type latch slave designated 142. Also, slave 142 is latched by the current path from latch emitters 26 and 48 through transistor 32. Conversely, when $C_i$ transitions from high to low, transistor 59 conducts current from latch emitters 54 and 56 and thus latches the master 140, while transistor 34 also conducts and enables the $\overline{D}$-type latch of slave 142 to adopt, at its output $Q_i$, the logical complement of $Q_i^M$. This necessarily produces a change in state for $Q_i$ since $Q_i^M$ was equal to $Q_i$ before the transition of $C_i$ from high to low.

Figure 13:
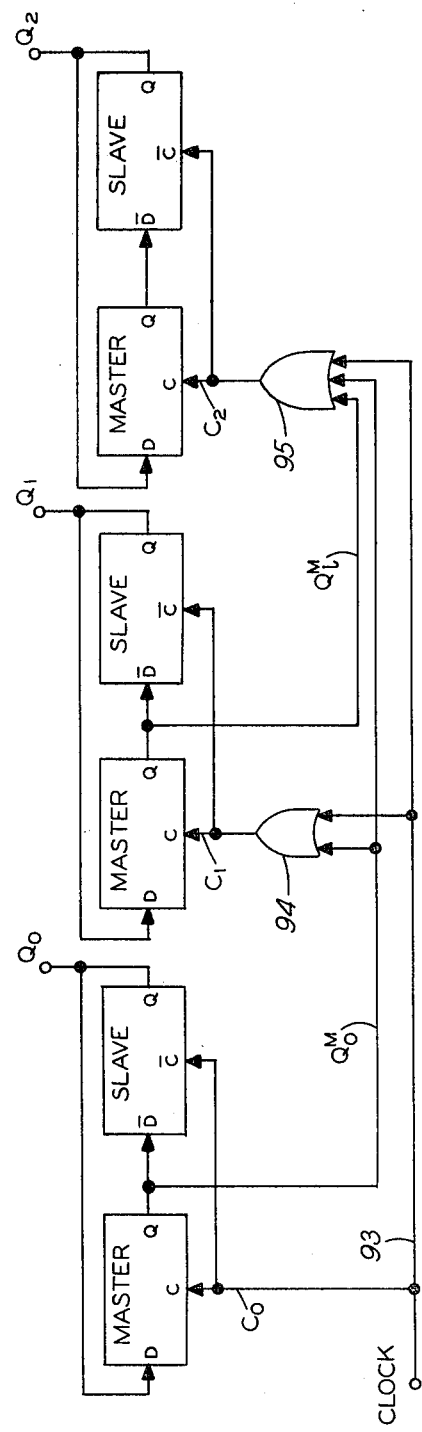
FIG. 13 is a logic block diagram of a three stage synchronous binary down counter employing the cells of FIG. 11 in accordance this invention.

With reference now to FIG. 13, there is shown, analogous to FIG. 10, a logic block diagram of a three-stage, i.e., three-bit, synchronous binary down counter of the type indicated by the timing diagram of FIG. 7 and employing the cells of FIG. 11. As with the up counter of FIG. 10, the cells of the down counter of FIG. 13 are concatenated in accordance with the foregoing Boolean equation and any number of cells may be used.

In FIG. 13, as in FIG. 10, the CLOCK signal on a line 93 provides a control signal $C_0$ to the first stage. The $Q_0^M$ output of the first stage is combined by an OR gate 94 with the CLOCK to provide a control input $C_1$ for the second stage. In like manner the $Q_1^M$ output of the second stage is combined by an OR gate 95 with $Q_0^M$ and the CLOCK to provide a control input $C_2$ to the third stage. Just as with the up counter, the output of any cell (0, 1 or 2) in FIG. 13 will change state only when its control input $C_i$ transitions from high to low.

The basic reason the counter of FIG. 13 decrements, i.e., counts down, rather than increments, i.e., counts up, is that in FIG. 13 when the clock is high, $Q_j^M = Q_j$ rather than $\overline{Q_j}$ as in the up counter. Thus, in FIG. 13, $Q_j$ can only change state when the clock transitions from high to low if all preceding (lower significant bit) outputs are low. This, of course, is the basic requirement of a down counter; and so the concatenated $\overline{D}/D$ latches (indicating master = D-type latch, slave = $\overline{D}$-type latch) decrement in a binary numerical sequence. Conversely, in a counter such as in FIG. 10 using $\overline{D}/D$ cells, $Q_j^M = \overline{Q_j}$ and so any particular $Q_j$ can change state when the clock transitions from high to low only if all preceding (lower significant bit) outputs are high. That is the basic requirement of an up counter.

SYNCHRONOUS BINARY UP/DOWN COUNTER

The foregoing has demonstrated that a synchronous binary up counter can be constructed by concatenating identical basic cells of $\overline{D}/D$ master/slave latches or flip flops in accordance with the foregoing Boolean equation, and further that a synchronous binary down counter can be constructed by concatenating identical basic cells of $D/\overline{D}$ master/slave latches or flip-flops in accordance with the same Boolean equation. Accordingly, it can now be appreciated that a synchronous binary up/down counter can be constructed by concatenating, in accordance with the same Boolean equation, a plurality of identical basic cells which can be controlled by a control line to operate in $\overline{D}/D$ master/slave relationship when incrementing is desired and in $D/\overline{D}$ master/slave relationship when decrementing is desired. Separate embodiments of such a basic i-th cell are shown in FIGS. 14–17.

Figure 14:
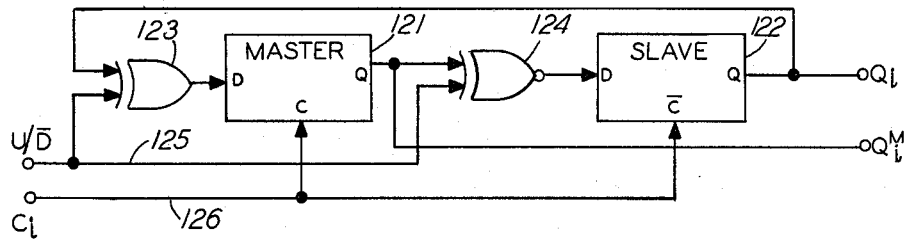
FIGS. 14–17 are logic block diagrams illustrating four representative embodiments of generalized cells for synchronous binary up/down counters in accordance with this invention.

As seen in FIG. 14 a basic i-th cell for an up/down counter can include a D-type master latch 121 and also a D-type slave latch 122 interconnected through an exclusive OR (written XOR) gate 123 and an exclusive NOR (written XNOR) gate 124. The output $Q_i$ of the cell is coupled to one input of XOR gate 123, the output of which is coupled to the input of master latch 121. The output $Q_i^M$ of master latch 121 is coupled to one input of XNOR gate 124, the output of which is coupled to the input of slave latch 122. A $U/\overline{D}$ control signal on a line 125 is coupled to the other inputs of gates 123 and 124.

In operation, a logical ONE, or high level, on a $U/\overline{D}$ line 125 causes master/slave latches 121/122 to function in a $\overline{D}/D$ relationship; and a logical ZERO, or low level, on line 125 causes master/slave latches 121/122 to function in a $D/\overline{D}$ relationship, as will now be discussed in more detail. If $U/\overline{D}=1$, then XOR gate 123 provides a 1-input to master latch 121 if $Q_i=0$ and a 0-input to master latch 121 if $Q_i=1$. Since master latch 121 is a D-type latch, $Q_i^M$ is the same as the input to master latch 121; and accordingly it is seen that $Q_i^M = \overline{Q_i}$ for $U/\overline{D}=1$. Further, for $U/\overline{D}=1$, the output of XNOR gate 124 provides a 0-input to slave latch 122 if $Q_i^M=0$ and a 1-input to slave latch 122 if $Q_i^M=1$. Thus slave latch 122 in combination with XNOR gate 124 functions as a D-type latch for $U/\overline{D}=1$. Thus, in summary, for $U/\overline{D}=1$, $Q_i^M = \overline{Q_i}$ and the master/slave latches 121/122 of FIG. 14 in combination with gates 123 and 124 function in $\overline{D}/D$ relationship. As taught hereinabove, this provides an up count function.

Conversely, if $U/\overline{D}=0$, then XOR gate 123 provides a 0-input to master latch 121 if $Q_i=0$ and a 1-input to master latch 121 if $Q_i=1$. Further, XNOR gate 124 provides a 1-input to slave latch 122 if $Q_i^M=0$ and a 0-input to slave latch 122 if $Q_i^M=1$. Thus, the combination of XOR gate 123 and master latch 121 functions as a D-type latch and the combination of XNOR gate 124 and slave latch 122 functions as a $\overline{D}$-type latch for $U/\overline{D}=0$. As taught hereinabove, this provides a down count function. Thus, it has been shown that the cell of FIG. 14 is controllable by a digital $U/\overline{D}$ signal to provide up counting or down counting, as desired.

Figure 15:
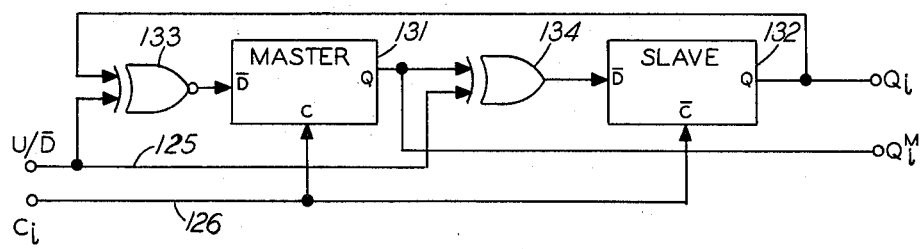

With reference now to FIG. 15, there is shown a logic block diagram illustrating an analogous, but alternate, i-th cell of an up/down counter cell. As seen, the cell of FIG. 15 includes a $\overline{D}$-type master latch 131 and a $\overline{D}$-type slave latch 132. The output $Q_i$ of the cell is coupled to one input of an XNOR gate 133, the output of which is coupled to the input of master latch 131. Similarly, the output $Q_i^M$ of master latch 131 is coupled to one input of an XOR gate 134, the output of which is coupled to the input of slave latch 132. A line 125 couples a $U/\overline{D}$ control signal to the other inputs of gates 133 and 134.

In operation if $U/\overline{D}=1$, XNOR gate 133 provides a 1-input to master latch 131 if $Q_i=1$ and a 0-input to master latch 131 if $Q_i=0$. Thus $Q_i^M=\overline{Q}_i$ (since master 131 is a $\overline{D}$-type latch). Further, XOR gate 134 provides a 0-input to slave latch 132 if $Q_i^M=1$ and a 1-input if $Q_i^M=0$. Because of the logic state negation in slave latch 132, a double negation thus occurs; and the combination of XOR gate 134 and slave latch 132 functions as a D-type latch. Thus, for $U/\overline{D}=1$, master/slave latches 131/132 in combination with gates 133 and 134 function in $\overline{D}/D$ relationship; and an up count function results.

Conversely in FIG. 15, if $U/\overline{D}=0$, then XNOR gate 133 provides a 0-input to master latch 131 if $Q_i=1$ and a 1-input if $Q_i=0$. Thus, the combination of XNOR gate 133 and master latch 131 functions as a D-type latch. XOR gate 134 provides a 1-input to slave latch 132 if $Q_i^M=1$ and a 0-input if $Q_i^M=0$. Thus, the combination of XOR gate 134 and slave latch 132 functions as a $\overline{D}$-type latch. Accordingly, for $U/\overline{D}=0$, a $D/\overline{D}$ relationship obtains and a down count function results.

Figure 16:
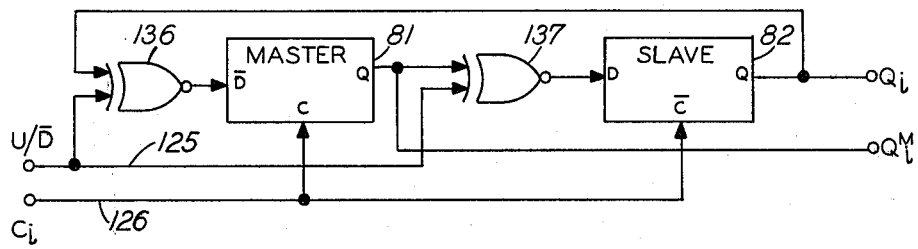

At this point, for completeness, it should be appreciated that the basic up counter cell of FIG. 9 can be converted to an up/down counter cell, as shown in FIG. 16, by inserting an XNOR gate 136 at the input to $\overline{D}$-type master latch 81 and another XNOR gate 137 at the input to D-type slave latch 82. A $U/\overline{D}$ control signal on a line 125 causes the $\overline{D}/D$ latches 81 and 82 to operate as though the XNOR gates 136 and 137 were not there, i.e., were functionally transparent, if $U/\overline{D}=1$ and to operate in a $D/\overline{D}$ relationship if $U/\overline{D}=0$. Alternatively, of course, XOR gates could be substituted for the XNOR gates 136 and 137, except that the polarity of the effect of the $U/\overline{D}$ signal would be complemented.

Figure 17:
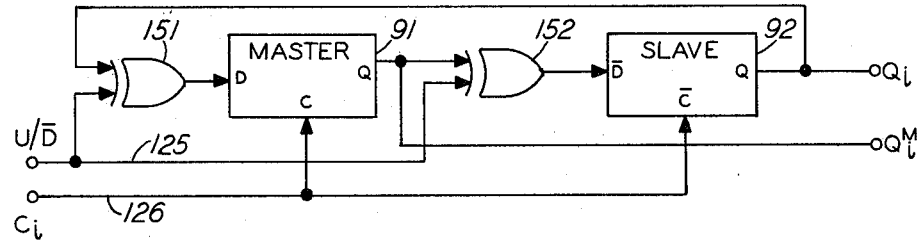

In like manner, the basic down counter cell of FIG. 11 can be converted to an up/down counter cell, as shown in FIG. 17, by inserting XOR gates 151 and 152 at the inputs to D-type master latch 91 and $\overline{D}$-type slave latch 92, respectively. If $U/\overline{D}=1$ on a line 153, XOR gates 151 and 152 operate as inverters, and latches 91/92 operate in $\overline{D}/D$ relationship, producing an up count function. If $U/\overline{D}=0$, latches 91 and 92 in combination with XOR gates 151 and 152 operate in $D/\overline{D}$ relationship, producing a down count function. And, of course, XNOR gates could be substituted for XOR gates 151 and 152, with the effect of complementing the polarity effectiveness of the $U/\overline{D}$ signal.

Figure 18:
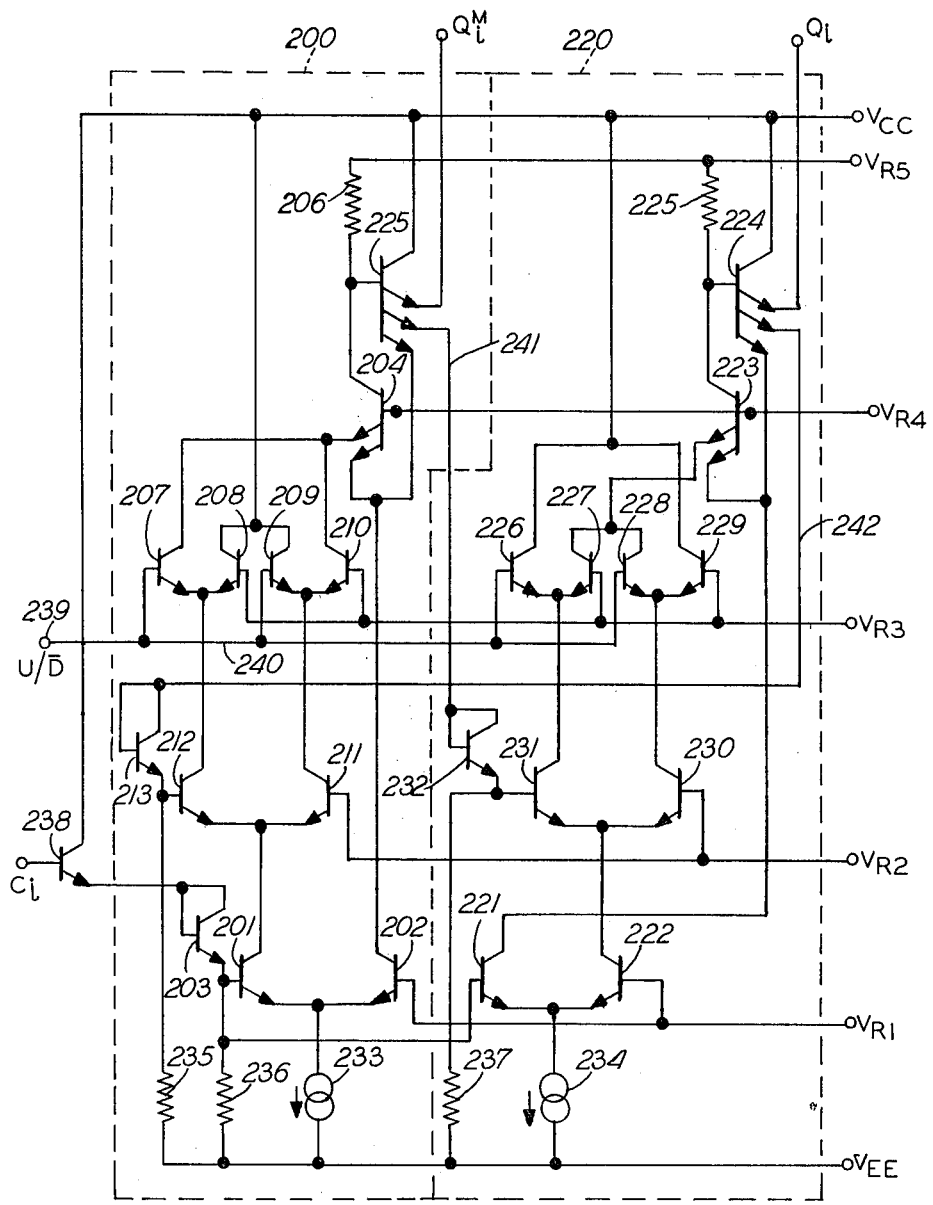
FIG. 18 illustrates a representative 4-EFL circuit realization of an up/down cell in accordance with this invention.

With reference now to FIG. 18, there is shown a specific four-level Emitter Function Logic (4-EFL) circuit realization of the up/down counter cell of FIG. 14. As seen, a master section, within broken-line rectangle 200, includes a D-type latch including transistors 201–205 and a resistor 206, similar to the D-type latches of FIGS. 2–4. An XOR function, provided by transistors 207–212, is merged into the D-type latch. A transistor 213, connected as a diode, serves as a logic level shifter.

Similarly, a slave section, within broken-line rectangle 220, includes a D-type latch including transistors 221–224 and a resistor 225. An XNOR function, provided by transistors 226–231, is merged into the D-type latch. A transistor 232, connected as a diode, serves as a logic level shifter. A first current source 233 drives master section 200, and a second current source 234 drives slave section 220. Resistors 235–237 serve functions analogous to the analogous resistors of FIGS. 2–4. It should be noted that a fifth regulated reference voltage $V_{R5}$ has been added in addition to the four regulated reference voltages $V_{R1}$–$V_{R4}$ of FIGS. 2–4. In manner analogous to the teachings with reference to FIGS. 1–4, $V_{R5}$ is 0.5 $V_{BE}$ more positive than $V_{R4}$ and $V_{R4}$, $V_{R3}$, $V_{R2}$ and $V_{R1}$ are separated by one $V_{BE}$, respectively.

In operation, if control signal $C_i$, applied through a level shifting transistor 238, is high and a direction control signal on a $U/\overline{D}$ input terminal 239, coupled to a $U/\overline{D}$ control line 240 is a logical ONE, or high level, a logical ONE at output transistor 224 of slave 220 causes transistors 212 and 207 to conduct and pull current through resistor 206, thus setting the master 200 at a logical ZERO. Conversely, a logical ZERO at output transistor 224 causes transistors 211 and 209 to conduct, pulling essentially no current through resistor 206 and setting master 200 at a logical ONE.

Similarly, if $C_i$ is low, and $U/\overline{D}$ remains high, a ONE output at transistor 205 in master 200 causes transistors 231 and 226 to conduct, pulling essentially no current through resistor 225 and thus setting the slave 220 at logical ONE. Conversely, a ZERO at transistor 205 causes transistors 230 and 228 to conduct, pulling current through transistor 223 and resistor 225 and thus setting the slave 220 at logical ZERO. Thus, for $U/\overline{D}=1$, the circuit of FIG. 18 operates in $\overline{D}/D$ relationship.

If in FIG. 18, $U/\overline{D}=0$, then when $C_i$ is high, a logical ONE at transistor 224 causes transistors 212 and 208 to conduct, thus pulling essentially no current through resistor 206 and thus setting master 200 at logical ONE. Similarly, a logical ZERO at transistor 224 causes transistors 211 and 210 to conduct and pull current through resistor 206 to set master 200 at logical ZERO. Thus, master 200 operates as a D-type latch.

If while $U/\overline{D}=0$, $C_i$ goes low, slave 220 is enabled and a logical ONE at transistor 205 causes transistors 231 and 227 to conduct, pulling current through resistor 225 and setting the output of slave 220 to ZERO. Conversely, a logical ZERO at transistor 205 causes transistors 230 and 229 to conduct, pulling essentially no current through resistor 225, and thus setting the output of slave 220 at logical ONE. Thus, for $U/\overline{D}=0$, the circuit of FIG. 18 operates in $D/\overline{D}$ relationship.

Finally, for hexadecimal down counting, U/D=0 and $E_{BC}=0$. In this condition, the control inputs to all gates 343–350 are low, causing them to act as inverters and changing the effective master/slave relationship to D/D for down counting. Thus, in this condition the circuit of FIG. 21 down counts like a four stage extension of the circuits of FIGS. 10 and 16 in hexadecimal mode.

Figure 21:
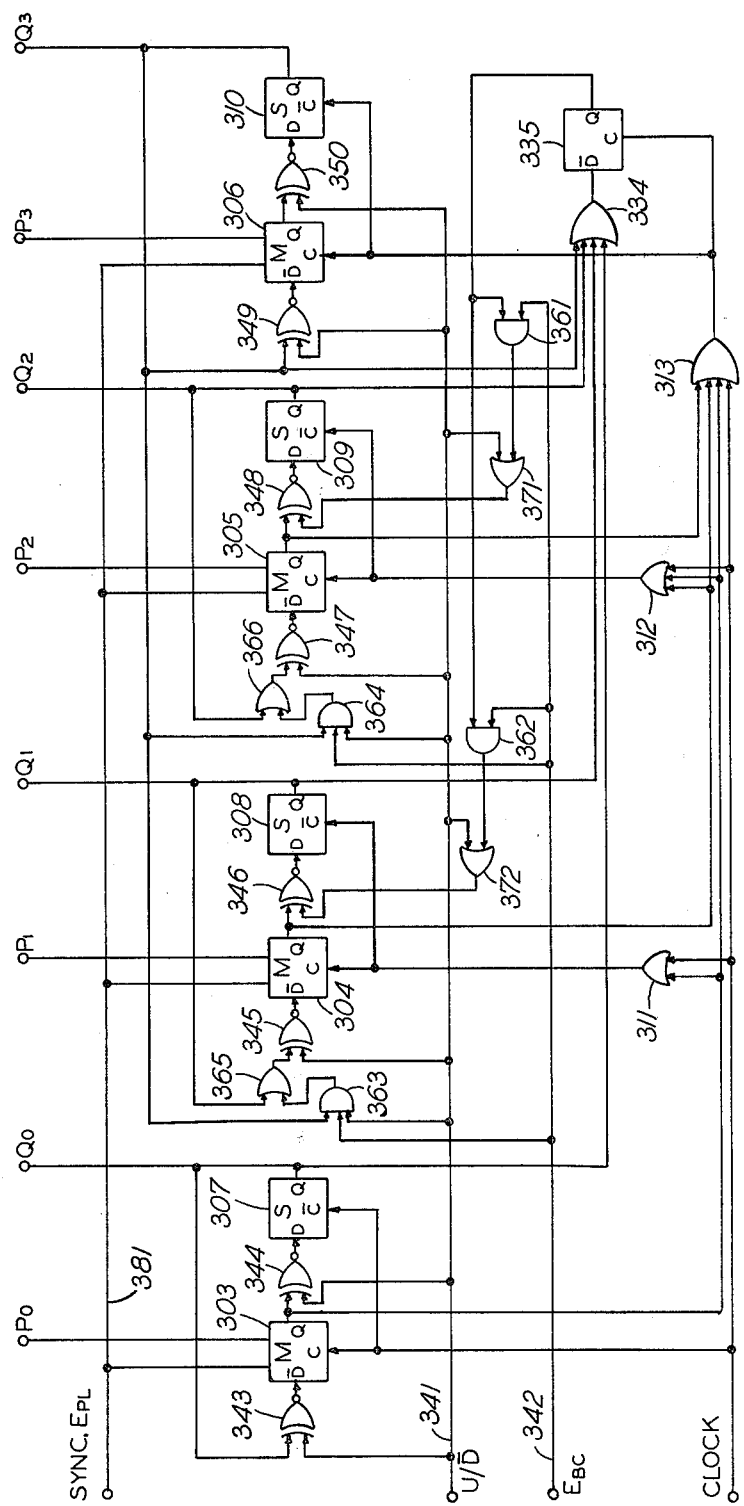
FIG. 21 is a logic block diagram illustrating a synchronous hexadecimal/BCD, up/down counter in accordance with this invention.

It will be observed that FIG. 21 illustrates a "SYNC $E_{PL}$" line 381 and $P_0$ through $P_3$ inputs coupled to masters 303–306, respectively, for enabling and providing a parallel loading, i.e., setting to any desired state, of the counter. Such can be implemented in accordance with the teachings of the aforementioned copending applications and do not affect the foregoing description.

Although the invention has been described in part by making detailed reference to the specific embodiments, such detail is intended to be and will be understood to be instructive rather than restrictive. It will be appreciated by those in the art that many variations may be made in the structure and mode of operation without departing from the spirit and scope of the invention, as disclosed in teachings contained herein. For example, the collectors of the transistors connected to $V_{CC}$ in FIGS. 1 through 4 could be connected to $V_{R4}$, thus eliminating a $V_{CC}$ bus line to the circuit, but at the expense of increasing current and current transients on the $V_{R4}$ line. Also, of course, as will be appreciated the logic levels could be referenced to $V_{CC}$ rather than $V_{R4}$ by simply eliminating $V_{R4}$ and connecting to $V_{CC}$ all points which were connected to $V_{R4}$. As is known, this allows the logical levels to vary with $V_{CC}$, but eliminates the need for the additional regulated reference voltage $V_{R4}$.

Further, as alluded to at various places hereinabove, the invention is not limited to the particular types of logic and controllable logic elements described with reference to the various figures of the drawing. Clearly, there are a great plurality of logically equivalent ways of implementing the foregoing teachings and all are considered within the spirit and scope hereof.

Still further, the invention is not limited to the specific circuit realizations described. Clearly, other types of transistors such as pnp transistors and MOS transistors, for example and without limitation, could be employed provided proper account is taken of polarities, etc., all of which is with the skill of the art.

What is claimed is:

1. A latch circuit for receiving a data signal at an input terminal for storing the complement of said signal and for providing the complement at an output terminal, and having terminal means for coupling said latch circuit to a constant current source, to a first supply voltage, and to a second supply voltage comprising:
    a first transistor having a base coupled to the input terminal, a collector and an emitter;
    a second transistor having a base coupled to a first reference voltage, a collector coupled to the first supply voltage terminal, and an emitter coupled to the emitter of said first transistor;
    a third transistor having a base coupled to a second reference voltage, a collector, and at least a first emitter coupled to the collector of said first transistor and a second emitter;
    a resistive element coupled between said collector of said third transistor and a third reference voltage; and
    a fourth transistor having a base coupled to said collector of said third transistor, a collector coupled to the first supply voltage terminal, and at least a first emitter coupled to the second emitter of said third transistor, and a second emitter coupled to the output terminal.

2. The latch circuit of claim 1, further including:
    clock-controlled means for providing a current path from the common connection of the emitters of said first and second transistors or from the common connection of the second emitter of said third transistor and the first emitter of said fourth transistor depending upon the level of a clock input signal with reference to a fourth reference voltage.

3. The latch circuit of claim 2, wherein said clock-controlled means comprises a pair of differentially connected transistors having common coupled emitters, separate collectors coupled, respectively, to the common connection of the emitters of the first and second transistors and the common connection of the second emitter of the third transistor and the first emitter of the fourth trnsistor, a base of one of said transistors adapted to receive the clock input signal, and a base of the other transistors coupled to said fourth reference voltage.

4. The latch circuit of claim 3, wherein a constant current source is coupled between the common coupled emitters of the last-mentioned differentially connected transistors and the second supply voltage terminal.

5. The latch circuit of claim 1 in combination with a noninverting latch circuit in a master/slave configuration to form a counter cell with the latch circuit of claim 1 forming a master latch and the noninverting latch forming the slave latch, and wherein the noninverting latch comprises:
    a fifth transistor having a base connected to said second reference voltage, a collector, and at least a first emitter connected to the output terminal of the latch circuit of claim 1 and a second emitter;
    a resistive element connected between the collector of said fifth transistor and said third reference voltage; and
    a sixth transistor having a base connected to the collector of said fifth transistor, a collector connected to the positive supply voltage terminal, and at least a first emitter connected to the input terminal of the latch circuit of claim 1 and a second emitter connected to the second emitter of said fifth transistor.

6. A combination latch circuit of claim 5, further including:
    first clock-controlled current steering means for providing a current path from the common connection of the emitters of said first and second transistors or from the common connection of the second emitter of said third transistor and the first emitter of said fourth transistor depending upon the condition of a clock input signal with a reference to a fourth reference voltage; and
    second clock switching means for providing a current path from the common connection of the second emitter of said fifth transistor and the second emitter of said sixth transistor or from the common connection of the first emitter of said fifth transistor and the output terminal of the last circuit of claim 1 depending upon the condition of the clock input signal with reference to said fourth reference voltage.

7. The combination latch circuit of claim 6, wherein said first and second-controlled current steering means are connected to the clock input signal such that:

a current path is provided from the common connection of the emitters of said first and second transistors at approximately the same time that a current path is provided from the common connection of the second emitter of said fifth transistor and the second emitter of said sixth transistor; and a current path is provided from the common connection of the second emitter of said third transistor and the first emitter of said fourth transistor at approximately the same time that a current path is provided from the common connection of the first emitter of said fifth transistor and the output terminal of the latch circuit in claim 1.

8. A combination latch circuit of claim 5, further including means for initializing the counter cell comprising:

a seventh transistor having a base connected to said first reference voltage, a collector connected to the second emitter of said sixth transistor, and an emitter;

an eighth transistor having a base connected to an initialization input terminal adapted to receive an initialization signal, a collector, and an emitter connected to the emitter of said seventh transistor;

a third emitter of said fifth transistor connected to the collector of said eighth transistor; and current steering means for providing a first current path from the common connection of the emitters of said first and second transistors, and a second current path from the common connection of the emitters of said seventh and eighth transistors during an initialization operation.

9. A combination latch of claim 8, wherein said current steering means further provides a third current path from the common connection of the second emitter of said third transistor and the first emitter of said fourth transistor, and a fourth current path from the common connection of the output terminal of the latch circuit of claim 1 and the first emitter of said fifth transistor, said first and second current paths or said third and fourth current paths being selected depending upon the condition of a clock input signal with respect to a fourth reference voltage during a non-initialization operation.

10. The latch circuit of claim 1 in combination with a noninverting latch circuit in a master/slave configuration to form a counter cell, with the latch circuit of claim 1 forming the master latch and the noninverting latch forming the slave latch, and wherein the noninverting latch comprises:

a fifth transistor having a base connected to said second reference voltage, a collector, and at least a first, a second, and a third emitter;

a resistive element connected between the collector of said fifth transistor and the third reference voltage;

a sixth transistor having a base connected to the collector of said fifth transistor, a collector connected to the first supply voltage terminal, and at least a first emitter connected to the input terminal of the latch circuit of claim 1, and a second emitter connected to a first emitter of said fifth transistor;

a seventh transistor having a base connected to said first reference voltage, a collector connected to the first emitter of said fifth transistor, and an emitter;

an eighth transistor having a base connected to an initialization input terminal adapted to receive an initialization signal, a collector connected to the second emitter of said fifth transistor, and an emitter connected to the emitter of said seventh transistor;

a ninth transistor having a base connected to said first reference voltage, a collector connected to the third emitter of said fifth transistor, and an emitter;

a tenth transistor having a base connected to the output terminal of the latch circuit of claim 3, a collector connected to the first supply voltage terminal, and an emitter connected to the emitter of said ninth transistor; and the combination further including current steering means for providing a first current path from the common connection of the emitters of said first and second transistors and a second current path from the common connection of the emitters of said seventh and eighth transistors during an initialization operation.

11. The combination latch of claim 10, wherein said current steering means further provides a third current path from the common connection of the second emitter of said third transistor and the first emitter of said fourth transistor, and a fourth current path from the common connection of the emitters of said ninth and tenth transistors, said first and second current paths or said third and fourth current paths being selected depending upon the condition of a clock input signal with reference to a fourth reference voltage during a non-initialization operation.

12. A complementary data EFL latch for receiving a data signal and a clock signal at a data terminal and a clock terminal respectively, and for providing a complementary output of the input data at an output terminal comprising:

a first and second npn single emitter transistor (SET) pair each having a base, a collector and an emitter connected in a differential configuration, having commonly coupled emitters, with the base of said first SET connected to the data terminal, the base of said second SET connected to a first reference voltage, and the collector of the second SET connected to a positive voltage terminal;

a storage cell comprising a first and a second npn multi-emitter transistor (MET), the first emitter of said first MET connected to the collector of the first SET, the base of the first MET connected to a second reference voltage, the collector of the first MET connected to the base of the second MET and through a resistor to a third reference potential, the collector of the second MET connected to the positive supply voltage terminal, the first emitter of the second MET connected to the output terminal, the second emitters of the first and second METs connected together; and current steering means connected through a constant current source to a negative supply voltage terminal for providing a current path from the emitters of the first and second SETs or from the second emitters of the first and second METs depending upon the voltage of the clock terminal with reference to a fourth reference voltage.

Finally, for hexadecimal down counting, U/D=0 and $E_{BC}=0$. In this condition, the control inputs to all gates 343-350 are low, causing them to act as inverters and changing the effective master/slave relationship to D/D for down counting. Thus, in this condition the circuit of FIG. 21 down counts like a four stage extension of the circuits of FIGS. 10 and 16 in hexadecimal mode.

It will be observed that FIG. 21 illustrates a "SYNC $E_{PL}$" line 381 and $P_0$ through $P_3$ inputs coupled to masters 303-306, respectively, for enabling and providing a parallel loading, i.e., setting to any desired state, of the counter. Such can be implemented in accordance with the teachings of the aforementioned copending applications and do not affect the foregoing description.

Although the invention has been described in part by making detailed reference to the specific embodiments, such detail is intended to be and will be understood to be instructive rather than restrictive. It will be appreciated by those in the art that many variations may be made in the structure and mode of operation without departing from the spirit and scope of the invention, as disclosed in teachings contained herein. For example, the collectors of the transistors connected to $V_{CC}$ in FIGS. 1 through 4 could be connected to $V_{R4}$, thus eliminating a $V_{CC}$ bus line to the circuit, but at the expense of increasing current and current transients on the $V_{R4}$ line. Also, of course, as will be appreciated the logic levels could be referenced to $V_{CC}$ rather than $V_{R4}$ by simply eliminating $V_{R4}$ and connecting to $V_{CC}$ all points which were connected to $V_{R4}$. As is known, this allows the logical levels to vary with $V_{CC}$, but eliminates the need for the additional regulated reference voltage $V_{R4}$.

Further, as alluded to at various places hereinabove, the invention is not limited to the particular types of logic and controllable logic elements described with reference to the various figures of the drawing. Clearly, there are a great plurality of logically equivalent ways of implementing the foregoing teachings and all are considered within the spirit and scope hereof.

Still further, the invention is not limited to the specific circuit realizations described. Clearly, other types of transistors such as pnp transistors and MOS transistors, for example and without limitation, could be employed provided proper account is taken of polarities, etc., all of which is with the skill of the art.

What is claimed is:

1. A latch circuit for receiving a data signal at an input terminal for storing the complement of said signal and for providing the complement at an output terminal, and having terminal means for coupling said latch circuit to a constant current source, to a first supply voltage, and to a second supply voltage comprising:
   a first transistor having a base coupled to the input terminal, a collector and an emitter;
   a second transistor having a base coupled to a first reference voltage, a collector coupled to the first supply voltage terminal, and an emitter coupled to the emitter of said first transistor;
   a third transistor having a base coupled to a second reference voltage, a collector, and at least a first emitter coupled to the collector of said first transistor and a second emitter;
   a resistive element coupled between said collector of said third transistor and a third reference voltage; and
   a fourth transistor having a base coupled to said collector of said third transistor, a collector coupled to the first supply voltage terminal, and at least a first emitter coupled to the second emitter of said third transistor, and a second emitter coupled to the output terminal.

2. The latch circuit of claim 1, further including:
   clock-controlled means for providing a current path from the common connection of the emitters of said first and second transistors or from the common connection of the second emitter of said third transistor and the first emitter of said fourth transistor depending upon the level of a clock input signal with reference to a fourth reference voltage.

3. The latch circuit of claim 2, wherein said clock-controlled means comprises a pair of differentially connected transistors having common coupled emitters, separate collectors coupled, respectively, to the common connection of the emitters of the first and second transistors and the common connection of the second emitter of the third transistor and the first emitter of the fourth trnsistor, a base of one of said transistors adapted to receive the clock input signal, and a base of the other transistors coupled to said fourth reference voltage.

4. The latch circuit of claim 3, wherein a constant current source is coupled between the common coupled emitters of the last-mentioned differentially connected transistors and the second supply voltage terminal.

5. The latch circuit of claim 1 in combination with a noninverting latch circuit in a master/slave configuration to form a counter cell with the latch circuit of claim 1 forming a master latch and the noninverting latch forming the slave latch, and wherein the noninverting latch comprises:
   a fifth transistor having a base connected to said second reference voltage, a collector, and at least a first emitter connected to the output terminal of the latch circuit of claim 1 and a second emitter;
   a resistive element connected between the collector of said fifth transistor and said third reference voltage; and
   a sixth transistor having a base connected to the collector of said fifth transistor, a collector connected to the positive supply voltage terminal, and at least a first emitter connected to the input terminal of the latch circuit of claim 1 and a second emitter connected to the second emitter of said fifth transistor.

6. A combination latch circuit of claim 5, further including:
   first clock-controlled current steering means for providing a current path from the common connection of the emitters of said first and second transistors or from the common connection of the second emitter of said third transistor and the first emitter of said fourth transistor depending upon the condition of a clock input signal with a reference to a fourth reference voltage; and
   second clock switching means for providing a current path from the common connection of the second emitter of said fifth transistor and the second emitter of said sixth transistor or from the common connection of the first emitter of said fifth transistor and the output terminal of the last circuit of claim 1 depending upon the condition of the clock input signal with reference to said fourth reference voltage.

7. The combination latch circuit of claim 6, wherein said first and second-controlled current steering means are connected to the clock input signal such that:

a current path is provided from the common connection of the emitters of said first and second transistors at approximately the same time that a current path is provided from the common connection of the second emitter of said fifth transistor and the second emitter of said sixth transistor; and a current path is provided from the common connection of the second emitter of said third transistor and the first emitter of said fourth transistor at approximately the same time that a current path is provided from the common connection of the first emitter of said fifth transistor and the output terminal of the latch circuit in claim 1.

8. A combination latch circuit of claim 5, further including means for initializing the counter cell comprising:

a seventh transistor having a base connected to said first reference voltage, a collector connected to the second emitter of said sixth transistor, and an emitter;

an eighth transistor having a base connected to an initialization input terminal adapted to receive an initialization signal, a collector, and an emitter connected to the emitter of said seventh transistor;

a third emitter of said fifth transistor connected to the collector of said eighth transistor; and current steering means for providing a first current path from the common connection of the emitters of said first and second transistors, and a second current path from the common connection of the emitters of said seventh and eighth transistors during an initialization operation.

9. A combination latch of claim 8, wherein said current steering means further provides a third current path from the common connection of the second emitter of said third transistor and the first emitter of said fourth transistor, and a fourth current path from the common connection of the output terminal of the latch circuit of claim 1 and the first emitter of said fifth transistor, said first and second current paths or said third and fourth current paths being selected depending upon the condition of a clock input signal with respect to a fourth reference voltage during a non-initialization operation.

10. The latch circuit of claim 1 in combination with a noninverting latch circuit in a master/slave configuration to form a counter cell, with the latch circuit of claim 1 forming the master latch and the noninverting latch forming the slave latch, and wherein the noninverting latch comprises:

a fifth transistor having a base connected to said second reference voltage, a collector, and at least a first, a second, and a third emitter;

a resistive element connected between the collector of said fifth transistor and the third reference voltage;

a sixth transistor having a base connected to the collector of said fifth transistor, a collector connected to the first supply voltage terminal, and at least a first emitter connected to the input terminal of the latch circuit of claim 1, and a second emitter connected to a first emitter of said fifth transistor;

a seventh transistor having a base connected to said first reference voltage, a collector connected to the first emitter of said fifth transistor, and an emitter;

an eighth transistor having a base connected to an initialization input terminal adapted to receive an initialization signal, a collector connected to the second emitter of said fifth transistor, and an emitter connected to the emitter of said seventh transistor;

a ninth transistor having a base connected to said first reference voltage, a collector connected to the third emitter of said fifth transistor, and an emitter;

a tenth transistor having a base connected to the output terminal of the latch circuit of claim 3, a collector connected to the first supply voltage terminal, and an emitter connected to the emitter of said ninth transistor; and the combination further including current steering means for providing a first current path from the common connection of the emitters of said first and second transistors and a second current path from the common connection of the emitters of said seventh and eighth transistors during an initialization operation.

11. The combination latch of claim 10, wherein said current steering means further provides a third current path from the common connection of the second emitter of said third transistor and the first emitter of said fourth transistor, and a fourth current path from the common connection of the emitters of said ninth and tenth transistors, said first and second current paths or said third and fourth current paths being selected depending upon the condition of a clock input signal with reference to a fourth reference voltage during a non-initialization operation.

12. A complementary data EFL latch for receiving a data signal and a clock signal at a data terminal and a clock terminal respectively, and for providing a complementary output of the input data at an output terminal comprising:

a first and second npn single emitter transistor (SET) pair each having a base, a collector and an emitter connected in a differential configuration, having commonly coupled emitters, with the base of said first SET connected to the data terminal, the base of said second SET connected to a first reference voltage, and the collector of the second SET connected to a positive voltage terminal;

a storage cell comprising a first and a second npn multi-emitter transistor (MET), the first emitter of said first MET connected to the collector of the first SET, the base of the first MET connected to a second reference voltage, the collector of the first MET connected to the base of the second MET and through a resistor to a third reference potential, the collector of the second MET connected to the positive supply voltage terminal, the first emitter of the second MET connected to the output terminal, the second emitters of the first and second METs connected together; and current steering means connected through a constant current source to a negative supply voltage terminal for providing a current path from the emitters of the first and second SETs or from the second emitters of the first and second METs depending upon the voltage of the clock terminal with reference to a fourth reference voltage.

13. A synchronous binary counter including a plurality of concatenated cells numbered 0 through n, wherein from $0 \leq i \leq n$, the i-th cell includes:
   a master latch having a data input, a control input, and an output $Q_i^M$, and being enabled by a first phase of a control signal $C_i$ applied to the control input to accept and store data and being latched during a second phase of $C_i$;
   a slave latch having a data input, a control input, and an output $Q_i$ providing an output for the cell, and being latched by the first phase of $C_i$ and being enabled by the second phase of $C_i$;
   one of the latches being an inverting latch and the other being a noninverting latch;
   means for coupling the output of the slave latch to the data input of the master latch; and means for coupling the output of the master latch to the data input of the slave latch; and
   means for interconnecting the cells such that
   $C_i = CLOCK + Q_{i-1}^M + Q_{i-2}^M \ldots + Q_1^M + Q_0^M$,
   where "CLOCK" indicates a count signal to be applied to the counter.

14. A counter as recited in claim 13, wherein the master latch is positive edge triggered and the slave latch is negative edge triggered.

15. A counter as recited in claim 13 wherein: the master latch is an inverting latch; and the slave latch is a noninverting latch, whereby the counter is functional as an up counter.

16. A counter as recited in claim 13 wherein: the master latch is a noninverting latch; and the slave latch is an inverting latch, whereby the counter is functional as a down counter.

17. A counter as recited in claim 13 wherein:
   the master latch includes means responsive to a direction control signal for causing the master latch to operate as an inverting latch in response to a first state of the direction control signal and for causing the master latch to operate as a noninverting latch in response to a second state of the direction control signal; and
   the slave latch including means responsive to the direction control signal for causing the slave latch to operate as a noninverting latch in response to the first state of the direction control signal and for causing the slave latch to operate as an inverting latch in response to the second state of the direction control signal,
   whereby the counter is functional as an up/down counter.

18. A counter as recited in claim 15, wherein the master latch is a $\overline{D}$-type latch and the slave latch is a D-type latch.

19. A counter as recited in claim 15 further adapted for operation as a BCD counter having four cells (n=3) and including:
   in the second cell (i=1), a first OR function disposed in the coupling between the output of the slave latch and the data input of the master latch such that $Q_1 + Q_3$ is applied to the data input of the master latch; and
   in the third cell (i=2), a second OR function disposed in the coupling between the output of the slave latch and the data input of the master latch such that $Q_2 + Q_3$ is applied to the data input of the master latch.

20. A counter as recited in claim 16, wherein the master latch is a D-type latch and the slave latch is a D-type latch.

21. A counter as recited in claim 16 further adapted for operation as a BCD counter having four cells (n=3) and including:
   an OR function providing $Q_0 + Q_1 + Q_2 + Q_3$ at an output thereof;
   an inverting latch having a data input coupled to the output of the OR function, a control input and an output $Q_F$, and being enabled by the first phase of $C_i$ applied to the control input and being latched by the second phase of $C_i$;
   in the second cell (i=1), a first XOR function disposed in the coupling between the output of the master latch and the data input of the slave latch such that the exclusive OR of $Q_1^M$ and $Q_F$ is applied to the data input of the slave latch; and
   in the third cell (i=2), a second XOR function disposed in the coupling between the output of the master latch and the data input of the slave latch such that the exclusive OR of $Q_2^M$ and $Q_F$ is applied to the data input of the slave latch.

22. A counter as recited in claim 21, wherein the last-mentioned inverting latch is a D-type latch.

23. A counter as recited in claim 44 wherein, for at least one of the cells, the master latch includes a noninverting latch portion and an XOR function disposed in the coupling between the output of the slave latch and the noninverting latch portion of the master latch such that in response to the first state of the direction control signal applied to an input of the XOR function the master latch operates as an inverting latch, and in response to the second state of the direction control signal the master latch operates as a noninverting latch.

24. A counter as recited in claim 23 wherein, for the said at least one cell, the slave latch includes a noninverting latch portion and an XNOR function disposed in the coupling between the output of the master latch and the noninverting latch portion of the slave latch such that in response to the first state of the direction control signal applied to an input of the XNOR function the slave latch operates as a noninverting latch, and in response to the second state of the direction control signal the slave latch operates as an inverting latch.

25. A counter as recited in claim 23 wherein, for the said at least one cell, the slave latch includes an inverting latch portion and an XOR function disposed in the coupling between the output of the master latch and the inverting latch portion of the slave latch such that in response to the first state of the direction control signal applied to an input of the XOR function the slave latch operates as a noninverting latch, and in response to the second state of the direction control signal the slave latch operates as an inverting latch.

26. A counter as recited in claim 44 wherein, for at least one of the cells, the master latch includes an inverting latch portion and an XNOR function disposed in the coupling between the output of the slave latch and the inverting latch portion of the master latch such that in response to the first state of the direction control signal applied to an input of the XNOR function the master latch operates as an inverting latch, and in response to the second state of the direction control signal the master latch operates as a noninverting latch.

27. A counter as recited in claim 26 wherein, for the said at least one cell, the slave latch includes a noninverting latch portion and an XNOR function disposed in the coupling between the output of the master latch and the noninverting latch portion of the slave portion such that in response to the first state of the direction control signal applied to an input of the XNOR function the slave latch operates as a noninverting latch, and in response to the second state of the direction control signal the slave latch operates as an inverting latch.

28. A counter as recited in claim 26 wherein, for the said at least one cell, the slave latch includes an inverting latch portion and an XOR function disposed in the coupling between the output of the master latch and the inverting latch portion of the slave latch such that in response to the first state of the direction control signal applied to an input of the XOR function the slave latch operates as a noninverting latch, and in response to the second state of the direction control signal the slave latch operates as an inverting latch.

29. A counter as recited in claim 17 wherein, for at least one of the cells, the master latch includes an inverting latch portion and an XOR function disposed in the coupling between the output of the slave latch and the inverting latch portion of the master latch such that in response to the first state of the direction control signal applied to an input of the XOR function the master latch operates as an inverting latch, and in response to the second state of the direction control signal the master latch operates as a noninverting latch.

30. A counter as recited in claim 29 wherein, for the said at least one cell, the slave latch includes a noninverting latch portion and an XOR function disposed in the coupling between the output of the master latch and the noninverting latch portion of the slave latch such that in response to the first state of the direction control signal applied to an input of the XOR function the slave latch operates as a noninverting latch, and in response to the second state of the direction control signal the slave latch operates as an inverting latch.

31. A counter as recited in claim 29 wherein, for the said at least one cell, the slave latch includes an inverting latch portion and an XNOR function disposed in the coupling between the output of the master latch and the inverting latch portion of the slave latch such that in response to the first state of the direction control signal applied to an input of the XNOR function the slave latch operates as a noninverting latch, and in response to the second state of the direction control signal the slave latch operates as an inverting latch.

32. A counter as recited in claim 17 wherein, for at least one of the cells, the master latch includes a noninverting latch portion and an XNOR function disposed in the coupling between the output of the slave latch and the noninverting latch portion of the master latch such that in response to the first state of the direction control signal applied to an input of the XNOR function the master latch operates as an inverting latch, and in response to the second state of the direction control signal the master latch operates as a noninverting latch.

33. A counter as recited in claim 32 wherein, for the said at least one cell, the slave latch includes a noninverting latch portion and an XOR function disposed in the coupling between the output of the master latch and the noninverting latch portion of the slave latch such that in response to the first state of the direction control signal applied to an input of the XOR function the slave latch operates as a noninverting latch, and in response to the second state of the direction control signal the slave latch operates as an inverting latch.

34. A counter as recited in claim 32 wherein, for the said at least one cell, the slave latch includes an inverting latch portion and an XNOR function disposed in the coupling between the output of the master latch and the inverting latch portion of the slave latch such that in response to the first state of the direction control signal applied to an input of the XNOR function the slave latch operates as a noninverting latch, and in response to the second state of the direction control signal the slave latch operates as an inverting latch.

35. A counter as recited in claim 17 having four cells (n=3) and adapted for operation in a hexadecimal mode.

36. A counter as recited in claim 35, further adapted to count in BCD mode in response to a first state of a mode control signal and in hexadecimal mode in response to a second state of the mode control signal, comprising:

means responsive to the direction control signal and to the mode control signal for providing, in response to the first state of the direction control signal and the first state of the mode control signal, the logical OR of $Q_1$ and $Q_3$ to the data input of the master latch of the second state (i=1) and the logical OR of $Q_2$ and $Q_3$ to the data input of the third stage (i=2);

an OR function means providing $Q_0+Q_1+Q_2+Q_3$ at an output thereof;

an inverting latch having a data input coupled to the output of the OR function, a control input and an output $Q_F$, and being enabled by the first phase of $C_i$ applied to the control input and being latched by the second phase of $C_i$; and means responsive to the direction control signal and the mode control signal for providing, in response to the second state of the direction control signal and the first state of the mode control signal, the exclusive OR of $Q_1^M$ and $Q_F$ to the data input of the slave latch of the second cell and the exclusive OR of $Q_2^M$ and $Q_F$ to the data input of the slave latch of the third cell.

37. A counter as recited in claim 44, further adapted to count in BCD mode, comprising:

means responsive to the direction control signal for providing, in response to the first state of the direction control signal, the logical OR of $Q_1$ and $Q_3$ to the data input of the master latch of the second state (i=1) and the logical OR of $Q_2$ and $Q_3$ to the data input of the third stage (i=2);

an OR function means providing $Q_0+Q_1+Q_2+Q_3$ at an output thereof;

an inverting latch having a data input coupled to the output of the OR function; a control input and an output $Q_F$, and being enabled by the first phase of $C_i$ applied to the control input and being latched by the second phase of $C_i$; and means responsive to the direction control signal for providing, in response to the second state of the direction control signal, the exclusive OR of $Q_1^M$ and $Q_F$ to the data input of the slave latch of the second cell and the exclusive OR of $Q_2^M$ and $Q_F$ to the data input of the slave latch of the third cell.

38. A counter as recited in claim 44, further including a direction control line and wherein the master latch in at least one of the cells includes:

a master storage cell having a control input, a latch input, and an output providing $Q_i^M$;

a first current steering means having a first control input and a first pair of current paths for conducting current to a first common node, one of said paths being coupled to the latch input of the master storage latch;

a second current steering means having a second control input and a second pair of current paths for conducting current to a second common node, the other of the paths of the first current steering means being coupled to the second common node;

a third current steering means having a third control input and a third pair of current paths for conducting current to a third common node, the third common node being coupled to one of the paths of the second pair, and one of the paths of the third pair being coupled to the control input of the master storage cell;

a fourth current steering means having a fourth control input and a fourth pair of current paths for conducting current to a fourth common node, the fourth common node being coupled to the other of the paths of the second pair, one of the paths of the fourth pair being coupled to the control input of the master storage cell, and the other of the paths of the fourth pair being coupled in common with the paths of the third pair to a terminal adapted to receive a supply voltage;

the third and fourth control inputs being coupled either to the direction control line or to $Q_i$;

the second control input being coupled to the output $Q_i$ if the third and fourth control inputs are coupled to the direction control line, or to the direction control line if the third and fourth control inputs are coupled to $Q_i$; and the first control input being coupled to $C_i$.

39. A counter as recited in claim 38, wherein the slave latch includes:

a slave storage cell having a control input, a latch input, and an output providing $Q_i$;

a fifth current steering means having a fifth control input and a fifth pair of current paths for conducting current to a fifth common node, one of the paths of said fifth pair being coupled to the latch input of the slave storage latch;

a sixth current steering means having a sixth control input and a sixth pair of current paths for conducting current to a sixth common node, the sixth common node being coupled to the other path of the fifth pair of paths;

a seventh current steering means having a seventh control input and a seventh pair of current paths for conducting current to a seventh common node, the seventh common node being coupled to one of the paths of the sixth pair of paths;

an eighth current steering means having an eighth control input and an eighth pair of current paths for conducting current to an eighth common node, the eighth common node being coupled to the other path of the sixth pair of paths, one of the paths of the seventh pair being coupled in common with one of the paths of the eighth pair to the supply voltage terminal, and the other paths of the seventh pair and the eighth pair being coupled in common to the control input of the slave storage cell;

the seventh and eighth control inputs being coupled either to the direction control line or to $Q_i^M$;

the sixth control input being coupled to $Q_i^M$ if the seventh and eighth control inputs are coupled to the direction control line, or to the direction control line if the seventh and eighth control inputs are coupled to $Q_i^M$; and the fifth control input being coupled to $C_i$.

* * * * *

UNITED STATES PATENT OFFICE
CERTIFICATE OF CORRECTION

PATENT NO. : 4,378,505
DATED : March 29, 1983
INVENTOR(S) : R. J. Scavuzzo

It is certified that error appears in the above-identified patent and that said Letters Patent are hereby corrected as shown below:

Column 4, line 1, "D-type" should read --$\bar{\text{D}}$-type--. Column 7, line 55, "D-type" should read --$\bar{\text{D}}$-type--. Column 12, line 22, "C" should read --$\bar{\text{C}}$--. Column 13, line 4, "C" (second occurrence) should read --$\bar{\text{C}}$--. Column 14, line 13, "$\bar{\text{D}}$/D" should read --D/$\bar{\text{D}}$--. Column 15, line 66, "D/$\bar{\text{D}}$" should read --$\bar{\text{D}}$/D--. Column 17, line 66, "C" (second occurrence) should read --$\bar{\text{C}}$--. Column 19, line 55, "D/D" should read --D/$\bar{\text{D}}$--. Column 19, line 59, "D-type" should read --$\bar{\text{D}}$-type--. Column 21, line 1, "U-D" should read --U/$\bar{\text{D}}$--. Column 21, line 5, "D/D" should read --D/$\bar{\text{D}}$--. In the claims, Column 24, claim 10, line 14, Claim "3" should read Claim --1--. Column 26, claim 20, line 3, "D-type" should read --$\bar{\text{D}}$-type--. Column 26, claim 22, line 25, "D-type" should read --$\bar{\text{D}}$-type--. Column 26, claim 23, line 26, "44" should read --17--. Column 26, claim 26, line 56, "44" should read --17--. Column 28, claim 37, line 43, "44" should read --17--. Column 28, claim 38, line 64, "44" should read --17--.

Signed and Sealed this

Sixth Day of September 1983

[SEAL]

Attest:

GERALD J. MOSSINGHOFF

Attesting Officer

Commissioner of Patents and Trademarks